United States Patent
Murano et al.

(10) Patent No.: US 7,830,089 B2
(45) Date of Patent: Nov. 9, 2010

(54) ELECTRONIC DEVICE WITH A LAYER STRUCTURE OF ORGANIC LAYERS

(75) Inventors: Sven Murano, Dresden (DE); Jan Birnstock, Dresden (DE); Ansgar Werner, Dresden (DE); Markus Burghart, Lund (SE)

(73) Assignee: Novaled AG, Dresden (DE)

( * ) Notice: Subject to any disclaimer, the term of this patent is extended or adjusted under 35 U.S.C. 154(b) by 106 days.

(21) Appl. No.: 12/158,479

(22) PCT Filed: Dec. 22, 2006

(86) PCT No.: PCT/EP2006/012516

§ 371 (c)(1),
(2), (4) Date: Aug. 18, 2008

(87) PCT Pub. No.: WO2007/071450

PCT Pub. Date: Jun. 28, 2007

(65) Prior Publication Data

US 2009/0045728 A1    Feb. 19, 2009

(30) Foreign Application Priority Data

Dec. 23, 2005 (EP) .................................. 05028308
Jan. 20, 2006 (EP) .................................. 06001231

(51) Int. Cl.
*H01J 1/62* (2006.01)

(52) U.S. Cl. ...................................... 313/506; 313/504

(58) Field of Classification Search ................. 313/504, 313/506
See application file for complete search history.

(56) References Cited

U.S. PATENT DOCUMENTS

| 4,356,429 A | 10/1982 | Tang |
| 4,769,292 A | 9/1988 | Tang et al. |
| 5,093,698 A | 3/1992 | Egusa |
| 5,500,537 A | 3/1996 | Tsumura et al. |

(Continued)

FOREIGN PATENT DOCUMENTS

CA    2549309    9/2005

(Continued)

OTHER PUBLICATIONS

Tang et al. In "Organic Electroluminescent Diodes", Applied Physics Letters, 51, 913 (1987).

(Continued)

*Primary Examiner*—Vip Patel
(74) *Attorney, Agent, or Firm*—Sutherland, Asbill & Brennan, LLP

(57) ABSTRACT

The invention relates to an electronic device comprising a layer structure of organic layers, wherein said layer structure comprises a p-n-junction between an n-type doped organic layer provided as an organic matrix material doped with an n-type dopant and a p-type doped organic layer provided as a further organic matrix material doped with a p-type dopant, and wherein the n-type dopant and the p-type dopant both are molecular dopants, a reduction potential of the p-type dopant is equal or larger than about 0 V vs. $Fc/Fc^+$, and an oxidation potential of the n-type dopant is equal or smaller than about $-1.5$ V vs. $Fc/Fc^+$.

18 Claims, 14 Drawing Sheets

U.S. PATENT DOCUMENTS

Figure 1:
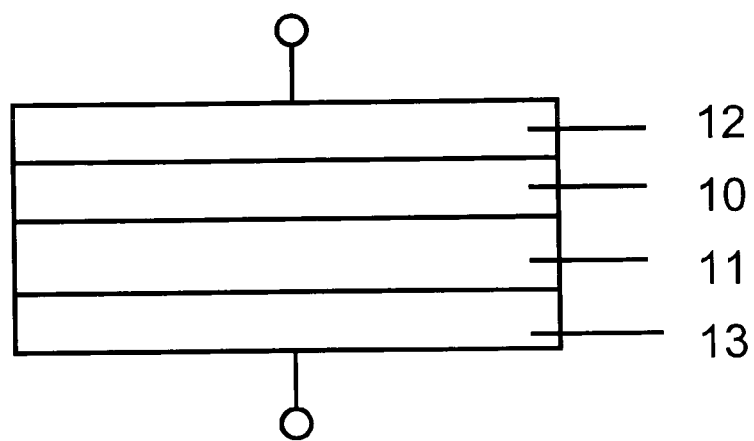

| | | | |
|---|---|---|---|
| 5,703,436 | A | 12/1997 | Forrest et al. |
| 5,757,026 | A | 5/1998 | Forrest et al. |
| 5,811,833 | A | 9/1998 | Thompson |
| 5,840,217 | A | 11/1998 | Lupo et al. |
| 5,917,280 | A | 6/1999 | Burrows et al. |
| 5,969,474 | A | 10/1999 | Aria |
| 5,989,785 | A | 11/1999 | Ishihara et al. |
| 6,023,073 | A | 2/2000 | Strite |
| 6,107,734 | A | 8/2000 | Tanaka et al. |
| 6,274,980 | B1 | 8/2001 | Burrows et al. |
| 6,303,238 | B1 | 10/2001 | Thompson et al. |
| 6,310,360 | B1 | 10/2001 | Forrest et al. |
| 6,337,492 | B1 | 1/2002 | Jones et al. |
| 6,406,804 | B1 | 6/2002 | Higashi |
| 6,437,769 | B1 | 8/2002 | Kohayashi |
| 6,555,840 | B1 | 4/2003 | Hudson et al. |
| 6,566,807 | B1 | 5/2003 | Fujita et al. |
| 6,573,651 | B2 | 6/2003 | Adachi et al. |
| 6,579,422 | B1 | 6/2003 | Kasinuma |
| 6,580,027 | B2 | 6/2003 | Forrest et al. |
| 6,589,673 | B1 | 7/2003 | Kido et al. |
| 6,645,645 | B1 | 11/2003 | Adachi et al. |
| 6,720,573 | B2 | 4/2004 | Son |
| 6,734,457 | B2 | 5/2004 | Yamazaki |
| 6,835,470 | B1 | 12/2004 | Magain |
| 6,867,538 | B2 | 3/2005 | Adachi et al. |
| 6,872,472 | B2 | 3/2005 | Liao et al. |
| 6,878,297 | B1 | 4/2005 | Berger |
| 6,897,473 | B1 | 5/2005 | Burroughes et al. |
| 6,900,588 | B2 | 5/2005 | Adachi et al. |
| 6,908,783 | B1 | 6/2005 | Kuehl et al. |
| 6,911,666 | B2 | 6/2005 | Voutsas et al. |
| 6,933,522 | B2 | 8/2005 | Lin |
| 6,936,961 | B2 | 8/2005 | Liao et al. |
| 6,965,197 | B2 | 11/2005 | Tyan |
| 6,979,414 | B2 | 12/2005 | Hosokawa et al. |
| 7,001,536 | B2 | 2/2006 | Thompson et al. |
| 7,074,500 | B2 | 7/2006 | Pfeiffer |
| 7,161,292 | B2 | 1/2007 | Leo |
| 7,163,831 | B2 | 1/2007 | Hasegawa et al. |
| 7,301,167 | B2 | 11/2007 | Ko |
| 7,473,410 | B1 | 1/2009 | Huffman et al. |
| 2001/0033136 | A1 | 10/2001 | Kawase |
| 2002/0030440 | A1 | 3/2002 | Yamazaki |
| 2002/0041975 | A1 | 4/2002 | Ueda et al. |
| 2002/0048688 | A1 | 4/2002 | Fukuoka et al. |
| 2002/0071082 | A1 | 6/2002 | Hiroyuki et al. |
| 2002/0084993 | A1 | 7/2002 | Teneya et al. |
| 2002/0098379 | A1 | 7/2002 | Arakane |
| 2002/0109136 | A1 | 8/2002 | Seo et al. |
| 2003/0020073 | A1 | 1/2003 | Long et al. |
| 2003/0042848 | A1 | 3/2003 | Park et al. |
| 2003/0052616 | A1 | 3/2003 | Antoniadis et al. |
| 2003/0098946 | A1 | 5/2003 | Blaessing et al. |
| 2003/0127973 | A1 | 7/2003 | Weaver et al. |
| 2003/0146443 | A1 | 8/2003 | Atsushi et al. |
| 2003/0170491 | A1 | 9/2003 | Liao et al. |
| 2003/0178619 | A1 | 9/2003 | Forrest et al. |
| 2003/0189401 | A1 | 10/2003 | Kido et al. |
| 2003/0230980 | A1 | 12/2003 | Forrest et al. |
| 2004/0012980 | A1 | 1/2004 | Sigiura et al. |
| 2004/0032220 | A1 | 2/2004 | Cok et al. |
| 2004/0062949 | A1 | 4/2004 | Pfeiffer et al. |
| 2004/0067324 | A1 | 4/2004 | Lazarev et al. |
| 2004/0104394 | A1 | 6/2004 | Lin et al. |
| 2004/0113547 | A1 | 6/2004 | Son |
| 2004/0119400 | A1 | 6/2004 | Takahashi et al. |
| 2004/0150330 | A1 | 8/2004 | Suh et al. |
| 2004/0183067 | A1 | 9/2004 | Strip et al. |
| 2004/0191952 | A1 | 9/2004 | Shtein et al. |
| 2004/0201018 | A1 | 10/2004 | Yamahara et al. |
| 2004/0214041 | A1 | 10/2004 | Lu |
| 2004/0227460 | A1 | 11/2004 | Liao et al. |
| 2004/0235209 | A1 | 11/2004 | Hasegawa et al. |
| 2004/0251816 | A1 | 12/2004 | Leo et al. |
| 2005/0029933 | A1 | 2/2005 | Liao et al. |
| 2005/0040390 | A1 | 2/2005 | Pfeiffer et al. |
| 2005/0040392 | A1 | 2/2005 | Wu et al. |
| 2005/0053801 | A1 | 3/2005 | Elschner et al. |
| 2005/0061232 | A1 | 3/2005 | Werner et al. |
| 2005/0073251 | A1 | 4/2005 | Kato |
| 2005/0086251 | A1 | 4/2005 | Hatscher et al. |
| 2005/0095736 | A1 | 5/2005 | Padiyath et al. |
| 2005/0110009 | A1 | 5/2005 | Blochwitz-Nimoth et al. |
| 2005/0118745 | A1 | 6/2005 | Yamazaki et al. |
| 2005/0173700 | A1 | 8/2005 | Liao et al. |
| 2005/0189875 | A1 | 9/2005 | Nakada |
| 2005/0218797 | A1 | 10/2005 | Bechtel et al. |
| 2005/0255334 | A1 | 11/2005 | Kang et al. |
| 2005/0269943 | A1 | 12/2005 | Hack et al. |
| 2005/0270279 | A1 | 12/2005 | Giraldo et al. |
| 2006/0033115 | A1 | 2/2006 | Blochwitz et al. |
| 2006/0038170 | A1 | 2/2006 | Brunschwiler et al. |
| 2006/0061266 | A1 | 3/2006 | Kang et al. |
| 2006/0065904 | A1 | 3/2006 | Uemura et al. |
| 2006/0145365 | A1 | 7/2006 | Halls et al. |
| 2006/0202196 | A1 | 9/2006 | Kawakami et al. |
| 2006/0231843 | A1 | 10/2006 | Qin et al. |
| 2006/0232992 | A1 | 10/2006 | Bertram et al. |
| 2006/0238112 | A1 | 10/2006 | Kasama et al. |
| 2006/0250076 | A1 | 11/2006 | Hofmann et al. |
| 2006/0273310 | A1 | 12/2006 | Birnstock et al. |
| 2007/0034860 | A1 | 2/2007 | Nakamura et al. |
| 2007/0051946 | A1 | 3/2007 | Walzer et al. |
| 2007/0278479 | A1 | 12/2007 | Werner et al. |
| 2008/0143250 | A1 | 6/2008 | Blochwitz-Nimoth et al. |
| 2008/0164807 | A1 | 7/2008 | Hofmann et al. |
| 2008/0203406 | A1 | 8/2008 | He et al. |
| 2009/0009071 | A1 | 1/2009 | Murano et al. |
| 2009/0009072 | A1 | 1/2009 | Wellmann et al. |

FOREIGN PATENT DOCUMENTS

| | | |
|---|---|---|
| DE | 19916745 | 10/2000 |
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |

| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Adachi et al. In "Electroluminescence in Organic Films with Three-Layer Structure", Japanese Journal of Applied Physics, 27, L269 (1988).
Tang et al. In "Electroluminescence of Doped Organic Thin Films", Journal of Applied Physics, 65, 3610 (1989).
A. J. Bard et al., Electrochemical Methods: Fundamentals and Applications, Wiley, 2nd edition 2000.
E. V. Tsiper et al., Phys. Rev. B 195124/1-12(2001).
Adachi, C. et al., "Efficient electrophosphorescence using a doped ambipolar conductive molecular organic thin film," Organic Electronics 2, (2001), pp. 37-43.
Adachi, C. et al., "High-efficiency organic electrophorescent devices with tris(2-phenylpyridine) iridium doped into electron-transporting materials," App. Phys. Lett. vol. 77, No. 6, Aug. 7, 2000.
Adachi, C. et al., "Nearly 100% internal phosphorescence efficiency in an organic light emitting device," Journal of Applied Physics (2001), vol. 90:10, pp. 5048-5051.
Adachi, et al. "Electroluminescence in Organic Films with Three-Layer Structure," Japanese Journal of Applied Physics, 27, L269 (1988).
Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).
Ammermann, D. et al., "Photonic devices based on crystalline organic semiconductors for optoelectronic integrated circuits," Jps. J. Appl. Phys. Pt. 1 (1995) vol. 34, pp. 1293-1297.
Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.
Baldo, et al. "Highly efficient phosphorescent emission from organic electroluminescent devices," Nature, vol. 395, Sep. 10, 1998, pp. 151-154.
Baldo, M. A. et al., "High efficiency fluorescent organic light-emitting devices using a phosphorescent sensitizer," Nature, (2000), vol. 403, pp. 750-753.
Baldo, M. A. et al., "Transient analysis of organic electrophosphorescence: I. Transient analysis of triplet energy transfer," Physical Review B, (2000), vol. 62:16, pp. 10958-10966.
Baldo, M. A. et al., "Very high-efficiency green organic light-emitting devices based on electrophosphorescence," Applied Physics Letters, (1999), vol. 75:1, pp. 4-6.
Baldo, M. A., et al., "Transient analysis of organic electrophosphorescence II. Transient analysis of triplet-triplet annihilation," Physical Review B, (2000), vol. 62:16, pp. 10967-10977.
Baldo, M., et al., "Organic vapor phase deposition," Advanced Materials, 1998, 10, No. 18, pp. 1505-1514.
Bandyopadhyay, A, et al. "Large conductance switching and memory effects in organic molecules for data-storage applications," Appl. Phys. Lett. 82, 1215 (2003).
Bard, A. J., Faulkner, R.J., Electrochemical Methods: Fundamentals and Applications, Wiley, 2nd Ed., 2000 (Chapter 2).
Bard, A. J., Faulkner, R.J., Electrochemical Methods: Fundamentals and Applications, Wiley, 2nd Ed., 2000 (Chapter 6).
Bastard, G., "Wave mechanics applied to semiconductor heterostructures," The Editions of Physique, (1988) pp. 64-67.
Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.
Baumgartel, H. et al., "Polarographische Untersuchungen zur Konformation von 1.2.3.4.5-pentaarylimidazoliumkationen," Ber. Bunsenges (1972) 76/2, 94-100.
Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.
Blochwitz, J. "Organic Light-Emitting Diodes with Doped Charge Transport Layers" Dissertation: Technische Universitat Dresden (2001). http://deposit.ddb.de/cgi-bin/dokserv?idn=963580051 &dok_var=dl&dok_ext=pdf&filename=963580051.pdf.
Blochwitz, J. et al., "Interface electronic structure of organic semiconductors with controlled doping levels," Org. Electronics 2, 97 (2001).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.
Bloom, C. J. et al., "Low work function reduced metal complexes as cathodes in organic electroluminescent devices," J. of Phyiscal Chemistry B, vol. 107, No. 13, pp. 2933-2938.
Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.
Carter, S. A. et al., "Enhanced luminance in polymer composite light emitting devices," Appl. Phys. Lett., vol. 71, pp. 1145-1147, Sep. 1997.
Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.
Colle, M. et al. "Switching and filamentary conduction in non-volatile organic memories," Organic Electronics, 7, 305-312 (Oct. 2006).
Connelly, N. G. et al., "Chemical Redox Agents for Organometallic Chemistry," Chem. Rev., 96, 877 (1996).
Cotton, F. et al., "Closed-shell molecules that ionize more readily than cesium," Science, vol. 298, No. 5600, pp. 1971-1974 (Dec. 6, 2002).
D'Andrade, B.W. et al., "Relationship between the ionization and oxidation potentials of molecular organic semiconductors," Organic Electronics 6, 2005, pp. 11-20.
D'Andrade, Brian W., "Operational stability of electrophosphorescent devices containing p and n doped transport layers," Applied Physics Letters, vol. 83, No. 19, Nov. 10, 2003, pp. 3858-3860.
D'Andrade, Brian W., et al., "Efficient organic electrophosphorescent white-light emitting device with a triple doped emissive layer," Advanced Materials, No. 7, 16, Apr. 5, 2004. pp. 624-628.
D'Andrade, Brian W., et al., "High-efficiency yellow double-doped organic light-emitting devices based on phosphorsensitized fluorescence," Appl. Phys. Lett., (2001), vol. 79:7, pp. 1045-1047.
Day et al. "The use of charge transfer interlayers to control hole injection in molecular organic light-emitting diodes," Thin Solid Films, 410 (2002) pp. 159-166.
Dodabalapur et al., "Organic transistors: Two-dimensional transport and improved electrical characteristics," Science, vol. 268, p. 270 (1995).
Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.
Feng, X.D. et al. "Ohmic Cathode for Low-Voltage Organic Light-Emitting Diodes," App. Phys. Lett., vol. 86, Article 143511 (Apr. 1, 2005): pp. 1-3.
Gao, W. et al., "Effect of electrical doping on molecular level alignment at organic-organic heterojunctions," Applied Physics Letters, vol. 82, No. 26, Jun. 30, 2003, pp. 4815-4817.
Gu, G. et al., "Transparent organic light emitting devices," Applied Physics Letters, (1996), vol. 68:19, pp. 2606-2608.
Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-3, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, MA et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetraniees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2-{4-[bis(4-methylphenyl)amino]phenyl}-5- (dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsiper, E.V. and Soos, Z.G.; "Charge redistribution and polarization energy of organic molecular crystals," Physical Review B; vol. 64; 195124-1.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798, filed Dec. 30, 2009.

Non-Final Office Action, U.S. Appl. No. 11/426,798, filed Jun. 24, 2009.

Restriction Requirement, U.S. Appl. No. 11/426,798, filed Mar. 10, 2009.

Response to Office Action, U.S. Appl. No. 11/426,798, filed Oct. 22, 2009.

International Search Report for PCT/EP2007/003311; Nov. 1, 2007.

European Search Report and Opinion for EP05028081.7; May 18, 2006.

International Search Report for PCT/EP2006/012403; Mar. 28, 2007.

International Search Report for PCT/DE2005/001076; Dec. 20, 2005.

Canadian Search Report for Application No. 2543276; Aug. 24, 2009.

Non-final Office Action for U.S. Appl. No. 11/279,514, filed Jan. 14, 2010.

Response to Office Action for U.S. Appl. No. 11/279,514, filed Aug. 12, 2009.

Final Office Action for U.S. Appl. No. 11/279,514, filed May 13, 2009.

Response to Office Action for U.S. Appl. No. 11/279,514, filed Feb. 27, 2009.

Non-final Office Action for U.S. Appl. No. 11/279,514, filed Oct. 30, 2008.

Restriction Requirement for U.S. Appl. No. 11/279,514, filed Jul. 2, 2008.

Supplemental Notice of Allowability for U.S. Appl. No. 10/515,935, filed Jul. 27, 2007.

Notice of Allowance for U.S. Appl. No. 10/515,935, filed Jun. 5, 2007.
Office Action for U.S. Appl. No. 10/515,935, filed Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582, filed Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2009.
International Search Report for PCT/DE2005/001493; Jan. 19, 2006.
International Search Report for PCT/DE2008/000638; Sep. 11, 2008.
Non-Final Office Action for U.S. Appl. No. 11/421,249, filed Oct. 19, 2009.
Response to Office Action for U.S. Appl. No. 11/421,249, filed Aug. 20, 2009.
Final Office Action for U.S. Appl. No. 11/421,249, filed May 20, 2009.
Response to Office Action for U.S. Appl. No. 11/421,249, filed Mar. 18, 2009.
International Search Report for PCT/EP2006/012516; Mar. 27, 2007.
Non-Final Office Action for U.S. Appl. No. 11/574,058, filed Dec. 9, 2009.
Disclosure Under 37 C.F.R. 1.56 for U.S. Appl. No. 12/158,479 Submitted Herewith.
Bettenhausen, J. et al. "Oxidiazoles and phenylquinoxalines as electron transport materials," Synthetic Metals 91 (1997) pp. 223-228.
Blochwitz-Nimoth, J, et al. "Fully organic PIN OLEDs with high power efficiency and long lifetime for the use in display and lighting applications," IMID '05 Digest, p. 955.
Doi, H. et al. "A novel class of emitting amorphous molecular materials with bipolar character for electroluminescence," Chem. Mater. 2003, 15, pp. 1080-1089.
Dreschsel, J, et al. "High efficiency organic solar cells based on single or multiple PIN structures," Thin Solid Films, 451-452 (2004) 515-517.
Gritzner, G. and Kuta, J., "Reccomendations on Reporting Electrode Potentials in Nonaqueous Solvents," Pure and Appl. Chem., vol. 56, No. 4, pp. 461-466, 1984.
Information Sheet on Evaporation Temperature, LIVILUX, Merck, SEB-010 Singlet Blue Host.
Information Sheet on Evaporation Temperature, NOVALED, World-class OLED Technology and Material.
Information Sheet on Evaporation Temperature, OLED-T: The One Stop Center (ELAMATES).
Kienel, G. and Sommerkamp, P., "Aufdampfen im Hochvakuum," Vakuum-Beschichtung 2, Dusseldorf 1995.
Lee, J. et al. "High efficiency and long lifetime OLED based on a metal-doped electron transport layer," Chem. Phys. Lett. 416 (2005) pp. 234-237.
Low, Paul J., et al. "Crystal, Molecular and Electronic Structure of N,N'-diphenyl-N,N'-bis(2,4-dimethylphenyl)-(1,1'-biphenyl)-4,4'-diamine and the corresponding radical cation," Chem. Eur. J. 2004, 10. pp. 83-91.
Meerheim, R. et al. "Ultrastable and efficient red organic light emitting diodes with doped transport layers," Applied Physics Letters 89, 061111 (2006).
Pommerehne, J. et al. "Efficient two layer LEDs on a polymer blend basis," Advanced Materials, 1995, 7, No. 6., p. 551.
Ren, X. et al. "Organometallic complexes as hole-transporting materials in organic light-emitting diodes," Inorg. Chem. 2004, 43, pp. 1697-1707.
Schmitz, C. et al. "A combinatorial study of the dependence of organic LED characteristics on layer thickness," Adv. Mater. 1999, 11, No. 10, p. 821.
Zhan, X. et al."Electron affinities of 1,1-diaryl-2,3,4,5-tetraphenylsiloloes: direct measurements and comparison with experimental and theoretical estimates," J. Am. Chem. Soc. 2005, 127, pp. 9021-9029.

ELECTRONIC DEVICE WITH A LAYER STRUCTURE OF ORGANIC LAYERS

The invention refers to an electronic device comprising a layer structure of organic layers.

BACKGROUND OF THE INVENTION

Electronic devices comprising a layer structure of organic layers have been proposed for different purposes. Among such devices are organic light emitting diodes (OLEDs), organic p-n-diodes, organic photovoltaic devices and alike.

Organic electroluminescent (EL) devices are becoming of increasing interest for applications in the field of displays or lighting sources. Such organic light emitting devices or organic light emitting diodes are electronic devices, which emit light if an electric potential is applied.

The structure of such OLEDs comprises, in sequence, an anode, an organic electroluminescent medium and a cathode. The electroluminescent medium, which is positioned between the anode and the cathode, is commonly comprised of an organic hole-transporting layer (HTL) and an electron-transporting layer (ETL). The light is then emitted near the interface between HTL and ETL where electrons and holes combine, forming excitons. Such a layer structure was used by Tang et al. in "Organic Electroluminescent Diodes", Applied Physics Letters, 51, 913 (1987), and U.S. Pat. No. 4,769,292, demonstrating high efficient OLEDs for the first time.

Since then, multitudes of alternative organic layer structures have been disclosed. One example being three-layer OLEDs which contain an organic light emitting layer (EML) between the HTL and ETL, such as that disclosed by Adachi et al. in "Electroluminescence in Organic Films with Three-Layer Structure", Japanese Journal of Applied Physics, 27, L269 (1988), and by Tang et al. in "Electroluminescence of Doped Organic Thin Films", Journal of Applied Physics, 65, 3610 (1989). The EML may consist of host material doped with a guest material, however neat light emitting layers may also be formed from a single material. The layer structure is then denoted as HTL/EML/ETL. Further developments show multilayer OLEDs which additionally contain a hole-injection layer (HIL), and/or an electron-injection layer (EIL), and/or a hole-blocking layer (HBL), and/or an electron-blocking layer (EBL), and or other types of interlayers between the EML and the HTL and/or ETL, respectively. These developments lead to further improvements in device performance, as the interlayers confine the excitons and the charge carriers within the emission zone and minimize quenching at the interface of the emissive region and the transport layers. They also might reduce the injection barrier from the transport layers into the emission zone, therefore leading to reduced operating voltages of the electroluminescent device.

A further improvement of the OLED performance can be achieved by the use of doped charge carrier transport layers as disclosed in EP 0498979 A1.

For this purpose, the ETL is doped with an electron donor such as an alkali metal, whereas the HTL is doped with an electron acceptor, such as F4-TCNQ. This redox type doping is based on a charge transfer reaction between the dopant and the matrix, releasing electrons (in the case of n-type doping) or holes (in the case of p-type doping) onto the charge carrier transport matrix. The dopants remain as charged species in the matrix, in the case of n-type doping the electron donors are positively charged, in the case of p-type doping the acceptor dopants are negatively charged.

OLEDs using doped charge carrier transport layers are commonly known as PIN-OLEDs. They feature extremely low operating voltages, often being close to the thermodynamical limit set by the wavelength of the emitted light.

One requirement for doped organic layers in OLEDs is that the excitons created within the emission zone have energies high enough to create visible light. The highest energy is needed for an emission in the blue range of the spectrum with a wavelength of 400-475 nm. To allow for such light emission, the electroluminescent material requires a sufficient band gap, which is about the energy of the emitted photons, or higher. It is desirable to choose the energy levels of the HTL and ETL carefully, such that the energy levels match with the emission zone to avoid additional barriers within the OLED device.

The energy levels are frequently identified as HOMO (highest occupied molecular orbital) or LUMO (lowest unoccupied molecular orbital). They can be related to the oxidation potential or the reduction potential of the material, respectively.

In this respect, redox potentials of materials can be provided as a voltage value vs. $Fc/Fc^+$. $Fc/Fc^+$ denotes the ferrocene/ferrocenium reference couple. Redox potentials can be measured for instance by cyclovoltammetry in a suitable solution, for instance acetonitrile or tetrahydrofuran. Details of cyclovoltammetry and other methods to determine reduction potentials and the relation of the ferrocene/ferrocenium reference couple to various reference electrodes can be found in A. J. Bard et al., "Electrochemical Methods: Fundamentals and Applications", Wiley, $2^{nd}$ edition 2000.

In case of redox type doping, the energy levels of the acceptor or donor dopants are of importance, too. They can be similarly established by electrochemical methods.

An alternative measure for the oxidation strength of the donor dopant molecule or the HOMO level energy can be ultraviolet photoelectron spectroscopy (UPS). By this method, the ionization potential is determined. It has to be distinguished, whether the experiment is carried out in the gas-phase or in the solid phase, i.e. by investigation of a thin film of the material. In the latter case, solid-state effects such as the polarization energy of the hole remaining in the solid after removal of the photoelectron give rise to deviations in the ionization potential as compared to gas-phase value. A typical value for the polarization energy is around 1 eV (E. V. Tsiper et al., Phys. Rev. B 195124/1-12 (2001).

In order to further improve the performance of OLEDs, such as for example the operation lifetime, stacked or cascaded OLED structures have been proposed, in which several individual OLEDs are vertically stacked. The improvement of the OLED performance in such stacked organic electroluminescent devices is generally attributed to an overall reduction of the operating current density combined with an increased operating voltage, as the individual OLEDs are connected in a row. Such a design leads to lower stress of the organic layers, since the current injected and transported within the organic layers is reduced. Additionally, the stacking of several OLED units in one device allows a mixing of different colours in one device, for example in order to generate white light emitting devices.

The realisation of such stacked or cascaded organic electroluminescent devices can for example be done by vertically stacking several OLEDs, which are each independently connected to a power source and which are therefore being able to independently emit light of the same or of different colour. This design was proposed to be used in full colour displays or other emission devices with an increased integrated density (U.S. Pat. No. 5,703,436, U.S. Pat. No. 6,274,980).

To avoid the need of connecting each of the individual OLEDs within the stacked devices, alternative designs were proposed, in which several OLEDs are vertically stacked without individually addressing each OLED in the unit stack. This can for example be done by placing an intermediate conductive layer with an electrical resistivity lower than 0.1 Ωcm in between the individual OLEDs, consisting of materials such as metals, metal alloys or inorganic compounds (U.S. Pat. Nos. 6,107,734, 6,337,492).

Alternatively, instead of using conductive intermediate layers, the usage of non-conductive charge generation layers (with a resistivity of not less than $10^5$ Ωcm) was disclosed in US2003/0189401 A1.

Even though a stable operation of stacked or cascaded OLEDs can be possible with such conductor or insulator interlayer approaches, the introduction of additional layers such as thin metals is required. Within a production process, these additional layers will cause additional costs, especially as these layers might be produced with different types of evaporation sources than the other organic layers within the stacked OLED devices.

Another approach for the fabrication of cascaded OLEDs was disclosed in EP 1 478 025 A2. Here, a layout using an additional intermediate p-n-junction, formed by an n-type doped organic layer and a p-type doped organic layer with a resistivity of each layer of more than 10 Ωcm in between the individual OLEDs is used to connect OLED units or electroluminescent units. In this approach the interface between the individual OLED units is formed by organic layers, which can be easily processed within an OLED manufacturing process. However, the approach demonstrated still requires the introduction of layers in addition to the layers used within the OLED units. A significant drawback of the approach is the fact, that the organic layers forming the p-n-junction are doped using inorganic elements and molecules with a small atom count. The stacked OLED devices are subject to a rapid breakdown during operation, most likely due to a dopant migration.

For stacked devices only limited lifetime data have been presented demonstrating operational lifetimes suitable for commercial applications.

Some molecular organic dopants, having a somewhat higher atom count such as F4-TCNQ are known in literature, which might be used for p-type doped organic charge transport layers instead of inorganic compounds; however this measure alone does not improve the stability of the stacked OLED devices. Especially the n-type doping could only be achieved by doping organic layers with alkali or earth alkali metals, which act as electron donors within organic layers. Even though there is prior art in which the use of metal salts and metal compounds is described (WO 03/044829 A1), the doping effect in these cases can only be attributed to a cleavage of the salts or compounds that release the metals in an uncharged state. One example is the doping with $Cs_2CO_3$, an inorganic salt that upon heating decomposes to release oxygen, $CO_2$ and caesium metal. N-type doping with metals in stacked devices that contain a p-n-interface being driven in reverse direction leads to a rapid breakdown due to metal migration at the junction.

In the document EP-A-1 339 112 in electronic device provided as a cascaded organic light emitting diode comprising a layer structure of organic layers is disclosed, wherein that layer structure comprises a p-n-junction between an n-type doped organic layer provided as an organic matrix material with an n-type dopant and a p-type doped organic layer provided as an organic matrix material with a p-type dopant.

The manufacturing of stacked or cascaded OLED devices with a stable operating lifetime requires the use of interlayers between the OLED units, such as metals, other conductors or insulators. These interlayers are sometimes also referred to as charge generation layers.

SUMMARY OF THE INVENTION

It is the object of the present invention to provide an electronic device comprising a layer structure of organic layers, where a p-n-junction within the structure of organic layers is stabilized.

It is another object of the invention to provide an organic light emitting device with stacked organic electroluminescent units comprising a simplified layer structure and still having a long operation lifetime. In this respect, it is a further object of the invention to provide an organic light emitting device with stacked organic electroluminescent units with a reduced increase in operation voltage during lifetime.

According to the invention an electronic device comprising a layer structure of organic layers according to claim 1 is provided. Advantageous developments of the invention are disclosed in dependent claims.

The inventors surprisingly found that long operation lifetimes of organic semiconductor devices comprising a p-n-junction in a structure of organic layers can be achieved by using molecular dopants for the p- and n-type doped layers at the p-n-interface which allows for a tailoring of the interface stability. With the use of molecular dopants, degradation mechanisms that occur in the case of doping with metals or small molecule dopants, can be minimized or even completely avoided.

For the p-n-junction according to the invention a reduced tendency of degradation, i.e. the irreversibly reduction of the device efficiency during operation, was observed.

In the present application, by the term molecular it is referred to inorganic or organic compounds that consist of more than six atoms within the dopant molecule. More favourable, the number of atoms forming the dopant molecules is larger than twenty. The molecular dopants are organic or inorganic molecules, but may also be molecular salts, i.e. salts that consist of at least two charged molecular subunits forming a salt. The molecular dopants might also be charge transfer complexes in which only a partial charge transfer between the constituting units occurs. In both cases at least one of the subunits forming the molecular salt or the molecular charge transfer complex also fulfils the above definition, namely an atom count of larger than six. Preferably, in one embodiment of the invention all the subunits forming the molecular salt or the molecular charge transfer complex fulfil the above definition, namely an atom count of larger than six.

The dopand molecule preferably does not comprise alkali metals since they are very prone to diffusion within the transport layers, which limits lifetime and thermal stability drastically.

A reduction potential of the p-type dopant is equal or larger than about 0 V vs. $Fc/Fc^+$, and an oxidation potential of the n-type dopant is equal or smaller than about −1.5 V vs. $Fc/Fc^+$.

In a preferred embodiment of the invention, the reduction potential of the p-type dopant is equal or larger than about 0.18 V vs. $Fc/Fc^+$, preferably equal or larger than about 0.24 V vs. $Fc/Fc^+$. In a further preferred embodiment of the invention, the oxidation potential of the n-type dopant is equal or smaller than about −2.0 V vs. $Fc/Fc^+$, preferably equal or smaller than about −2.2 V vs. $Fc/Fc^+$.

An alternative measure for the oxidation strength of the donor dopant molecule can be ultra-violet photoelectron spectroscopy (UPS). If measured by means of this method, an ionization potential of the donor dopant is equal or lower than about 5.5 eV, preferably equal or lower than about 5 eV, preferably equal or lower than about 4.8 eV measured in the solid state. If measured in the gas phase, the ionization potential of the donor dopant is equal or lower than about 4.5 eV, preferably equal or lower than about 4 eV, more preferably equal or lower than about 3.8 eV. These values correspond to the onset of photoemission at the high kinetic energy side, i.e. the weakest bound photoelectrons.

The proposed p-n-junction is also beneficial for stacked organic photovoltaic devices, as the open circuit voltage might be increased to a maximum of n-times the photon energy. Furthermore, in current organic photovoltaic devices, only less than 50% of the incident light is absorbed in the photoactive layer. The stacking of photovoltaic devices thus allows harvesting of more than 50% of the incident light due to the presence of more than one photoactive layer in the stack.

Another application of such p-n-junctions is in organic p-n-diodes, where a large difference in the Fermi-levels of the p- and n-type doped organic layers gives rise to a larger space charge region and larger depletion zones. This will result in lower generation currents and higher breakdown-voltages under reverse-bias operation. To a first approximation, the Fermi-levels of the p-doped layer is determined by the electron affinity of the acceptor dopant, while the Fermi-level of the n-doped layer is determined by the ionization potential of the donor dopant.

Obviously, for both mentioned embodiments a long-term stability especially upon applying a backward bias is desirable. These examples are non-limiting for the use of the p-n-junction architecture described within the present invention.

A backward bias or backward voltage is applied to a p-n-junction, if electrons are injected into the p-type doped transport layer from the electrode and holes are injected into the n-type doped transport layer from the other electrode. If the p-n-junction is not sandwiched between electrodes, a backward operation is given in the case, where the applied field is such, that electrons negative charges are moving from the p-type doped layer of the junction into the n-type doped layer of the junction and positive charges are moving in the opposite direction.

In the case of the molecular doping of the charge carrier transport layers the fixation of dopants is preferably ensured by the high molecular weight of the dopant (>300 g/mol) as well as the high atomic count of the compounds, preventing it from a migration into the n-type or p-type doped layer, respectively.

Furthermore a beneficial effect of the glass transition temperature ($T_g$) of the matrix materials used to for the p-n-junction for the device stability was found. The matrix material is preferably constituted of materials with a $T_g$ larger than about 75° C., preferably of larger than about 100° C., more preferably of larger than about 120° C. This value is an important factor for the dopants mobility; higher $T_g$ values lead to a stronger fixation of the dopant within the organic charge carrier transport layers.

The overall stability of the p-n-interface at the junction between the PIN-OLED units depends on both the $T_g$ of the matrix and the size of the dopants. A system consisting of a smaller dopant within a matrix with a high $T_g$ might be less stable than a larger size molecular dopant within a transport matrix having a lower $T_g$.

It was found also, that the stability of the electronic device is increased if the thermal stability of the doped layers forming the p-n-junction is increased. The thermal stability of a doped layer can be measured by heating the doped layer with a heating rate, for instance 1 K/min and monitoring the conductivity of the layer. As for any semiconductor, during the heating the conductivity increases. At a certain temperature (breakdown temperature), the conductivity decreases again because of morphological activities of the doped layer. It has been found, that the matrix is preferably constituted of materials that have a breakdown temperature of greater than 75° C., preferably of larger than 100° C. The breakdown temperature increases with the $T_g$ of the matrix material and the atom count of the dopant molecule.

Another measure for the stability of the dopant molecule is its vapour pressure. As a general rule, the vapour pressure at certain temperature is lowered with increasing the atom count of a compound. This is especially the case for conjugated molecules with high polarizability. The van-der-Waals forces lead to a strong interaction of the molecules requiring more energy for vaporization. The same van-der-Waals forces lead to strong interaction of the dopant molecule in the host material causing a fixation of the dopant in the doped layer. Consequently, a low vapour pressure of the dopant molecule can be beneficial for a stability of the doped layer and junctions formed with that doped layers.

In many cases, it is difficult to establish the vapour pressure of a molecular compound. In this case, one can use the evaporation temperature as a measure related to the vapour pressure. The term evaporation temperature refers to the temperature, to which the dopant molecule has to be heated in a evaporator source in order to have the target deposition rate at the position of a substrate place over the source. The deposition rate R can be written as $$R = \sqrt{\frac{M}{2\pi k T \rho^2}} \frac{P_e A}{4\pi r^2}$$

where M is the molar mass of the evaporated compound, k is Boltzmann's constant, T is the source temperature, $\rho$ is the density of the film, P is the vapour pressure, A is the source area, r is the distance of source and substrate plane.

In a preferred embodiment, when the distance r is about 50 cm, and the area of the source is 3.8 cm$^2$, dopants with a deposition rate of 0.005 nm/s at an evaporation temperature of about 120° C. or higher, preferably a temperature of about 140° C. or higher can be used to fabricate a stable p-n-junction. A low vapour pressure, i.e. a high evaporation temperature is preferred to produce further stabilization of the p-n-junction in a manufacturing process. This is because a dopant molecule with a high volatility will lead to a contamination of the adjacent layers, especially the adjacent doped layer of the p-n-junction due to the high background pressure of the volatile dopant in the process chamber.

The transport matrix materials at the p-n-interface might also consist of the same material, if this material can be p- and n-doped by molecular dopants.

In a preferred embodiment of the invention, an organic light emitting device is provided, wherein in one embodiment the organic light emitting device comprises an anode, a cathode, and a plurality of m (m>1) organic electroluminescent units (3.1, . . . , 3.m) each comprising an electroluminescent zone, where the organic electroluminescent units are provided upon each other in a stack or an inverted stack between the anode and the cathode, and where the p-n-junction is provided at an interface between adjacent organic electroluminescent units.

In a further preferred embodiment of the invention, for m>2:
  at least organic electroluminescent units (3.2, ..., 3.m−1) not adjacent to the anode (2) or the cathode comprise the p-type doped organic layer as a p-type doped hole transporting-layer, the n-type doped organic layer as a n-type doped electron-transporting layer, and the electroluminescent zone formed between the p-type doped hole transporting layer and the n-type doped electron transporting layer;
  in the stack or the inverted stack the n-type doped electron-transporting layer of the $k^{th}$ ($2 \leq k \leq m-2$) organic electroluminescent unit (3.k) is directly followed by the p-type doped hole-transporting layer of the $(k+1)^{th}$ organic electroluminescent unit (3.k+1), thereby providing a direct contact between the n-type doped electron-transporting layer of the $k^{th}$ organic electroluminescent unit (3.k) with the p-type doped hole-transporting layer of the $(k+1)^{th}$ organic electroluminescent unit (3.k+1); and
  the first organic electroluminescent unit (3.1) comprises a n-type doped electron-transporting layer which is in contact with the p-type doped hole-transporting layer of the second organic electroluminescent unit (3.2), and the $m^{th}$ organic electroluminescent unit (3.m) comprises a p-type doped hole-transporting layer which is in contact with the n-type doped electron-transporting layer of the $(m-1)^{th}$ organic electroluminescent unit (3.m−1).

Preferably, for m=2:
  a first electroluminescent unit (3.1) comprises the n-type doped organic layer as a n-type doped electron-transporting layer;
  a second electroluminescent unit (3.2) comprises the p-type doped organic layer as a p-type doped hole transporting-layer; and
  the n-type doped electron-transporting layer of the first electroluminescent unit (3.1) is in contact with the p-type doped hole-transporting layer of the second organic electroluminescent unit (3.2), thereby providing a p-n-junction between the two adjacent organic electroluminescent units (3.1, 3.2).

The approach of stacked organic electroluminescent units also referred to OLED units is of further advantage to other approaches known in the art, as the units can be directly laminated upon each other without the need of additional interlayers.

In a preferred embodiment, at least one of the m organic electroluminescent units further comprises at least one of the following layers: a hole-injection layer (HIL), an electron-injection layer (EIL), an interlayer in between the p-type doped hole-transporting layer and the electroluminescent zone, and a further interlayer between the n-type doped electron-transporting layer and the electroluminescent zone.

The p- and/or the n-doped transport layers of the p-n-junction might also individually consist of at least two layers in order to further stabilize the p-n-interface. Especially for stacked PIN-OLEDs, this is of advantage, if a stable transport matrix shows some absorption within the visible range of the electromagnetic spectrum. This is especially the case for white stacked OLEDs, where an emission over a broad spectral range is desired. In this case, the use of a two layer architecture allows for a stabilization of the interface in combination with a minimized absorption loss, as the stabilizing layer can be manufactured very thin.

It is to be understood, the invention may be used for a stacked PIN-OLED where for the p- and/or the n-type doped layers of different units, different matrix and/or dopant materials are used. This is especially beneficial in the case of stacked multicolour devices, where different energetic levels of the transport layers are desired for an optimum performance of the individual OLED units.

Another advantage of such a multilayer architecture of the p-type or n-type doped transport layers of the units is, to reduce costs, if the more stable charge carrier transport matrix is more expensive than less stable alternative materials. E.g. if metal complexes with core atoms of rare or noble metals are used, such as Iridium or Platinum, the material costs will necessarily be high due to the costs of the starting materials for the synthesis. This will even then be the case if the material is manufactured in mass production, which for standard organic materials usually leads to a significant cost reduction. In this case the use of a two layer architecture allows to reduce costs by minimizing the thickness of the layer formed by the expensive, stable material. Another advantage of the multilayer structure is that the doping concentration of the p-doped and n-doped layers can be reduced in the vicinity of the junction to give a wider space-charge region and by this a better rectification of a p-n diode. The doping concentration of other adjacent layers can be chosen in such a way that the conductivity is high enough to reduce ohmic losses.

It might furthermore be beneficial for the device lifetime, if the devices are operated with AC voltage or backward voltage pulses. Applying a reverse field to the device will force a backward migration of the charged dopant ions, which can partly slow down or even stop the degrading dopant migration mechanisms.

It was also found that further stability of the p-n-junction is influenced by the dopant concentration. For certain concentration combinations of the p- and the n-dopant a further stabilization was observed, which might be attributed to a formation of a salt between the different type of dopants, suppressing dopant migration.

DESCRIPTION OF PREFERRED
EMBODIMENTS OF THE INVENTION

Figure 2:
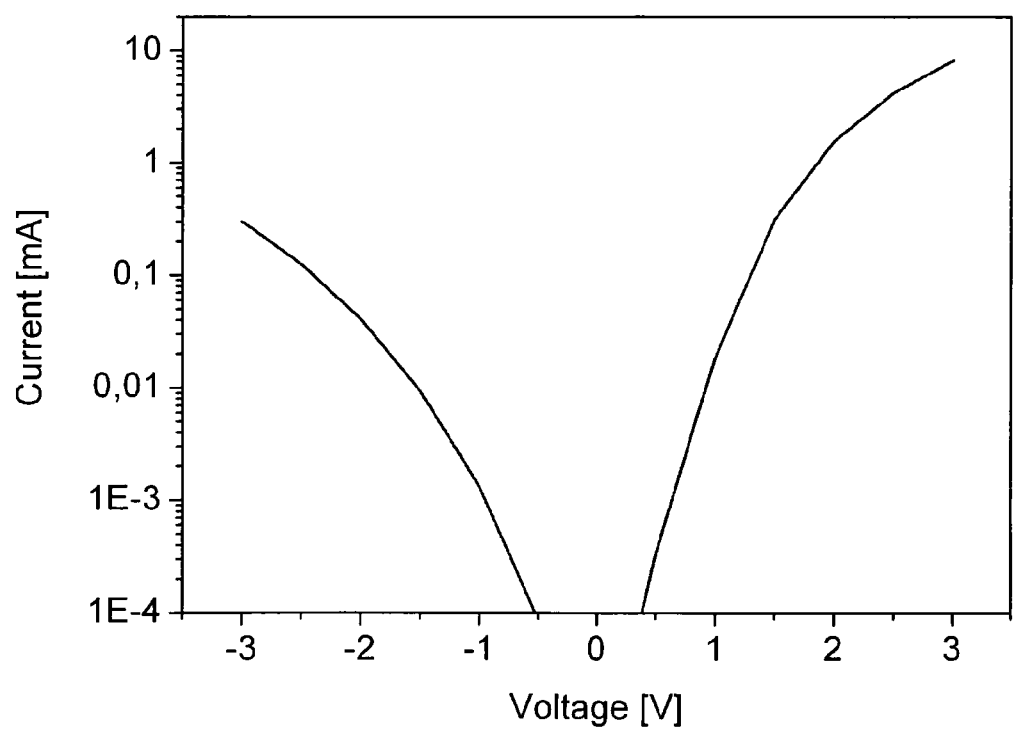
Figure 3:
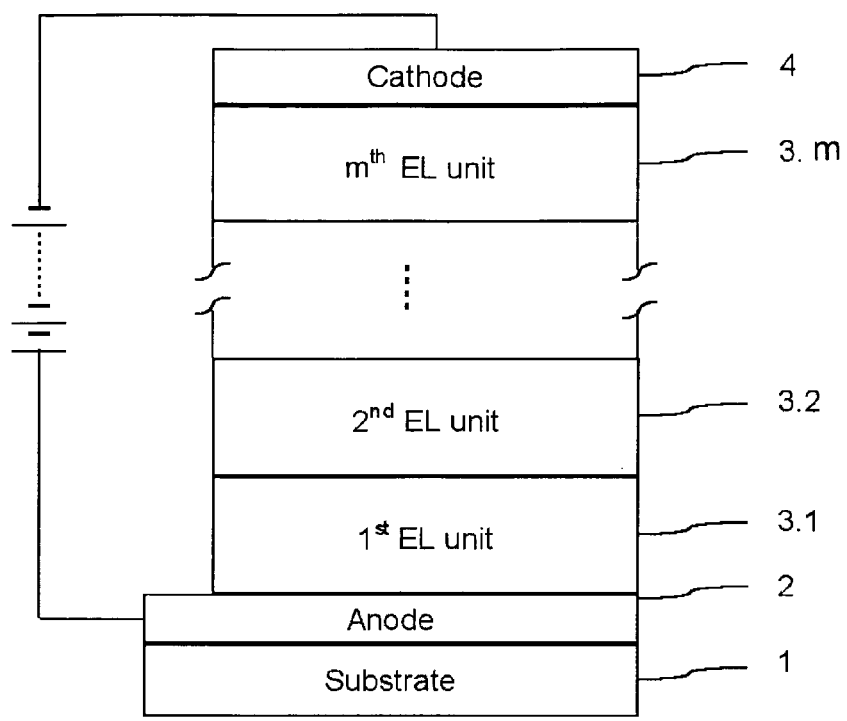
Figure 4:
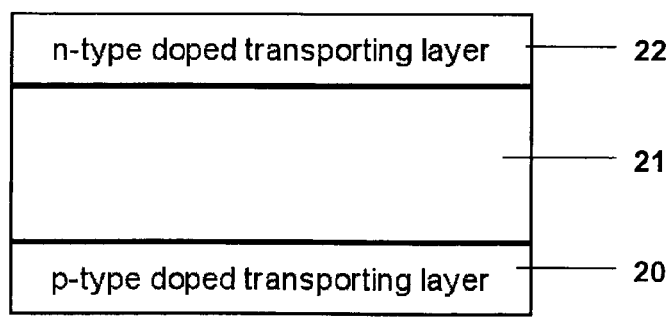
Figure 5A:
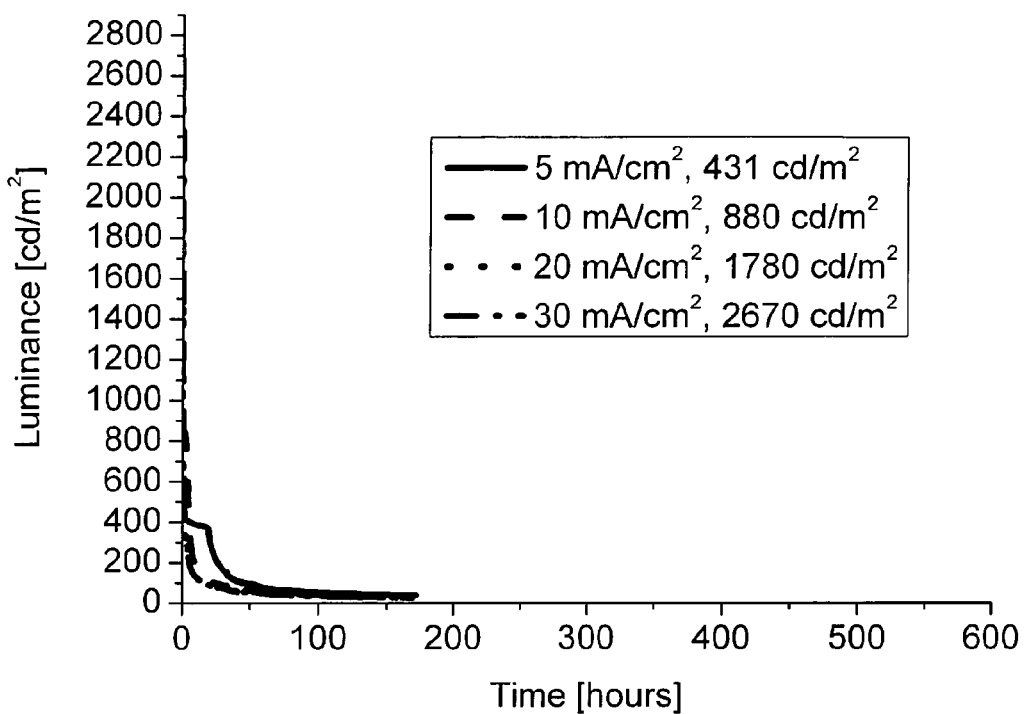
Figure 5B:
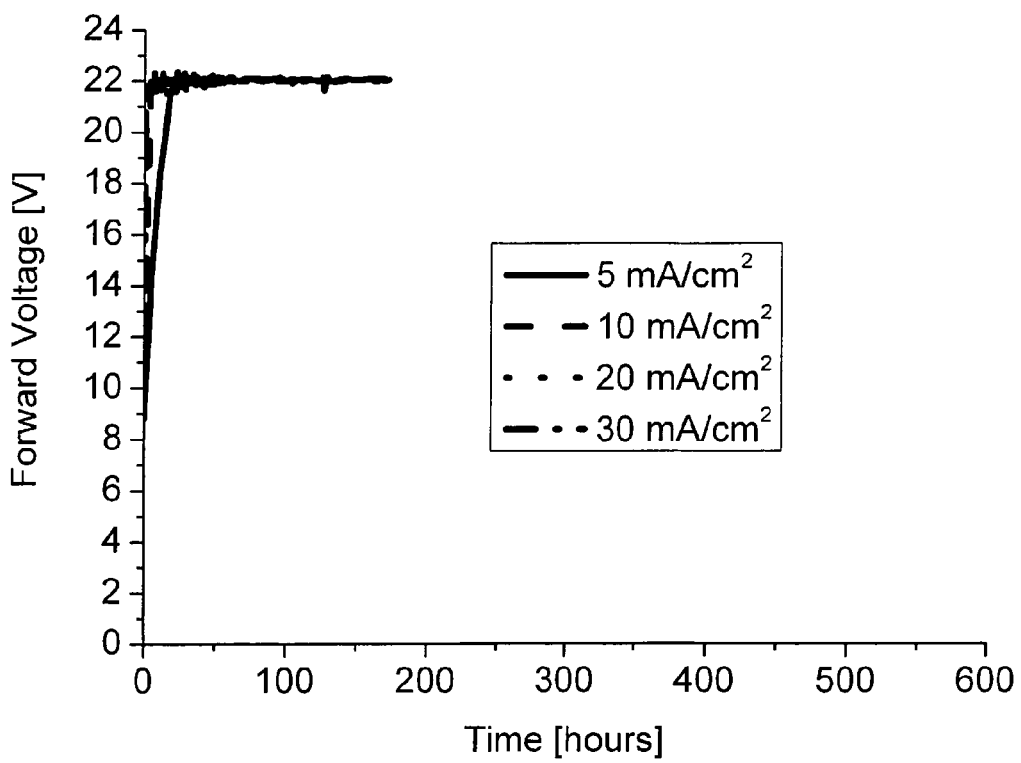
Figure 6A:
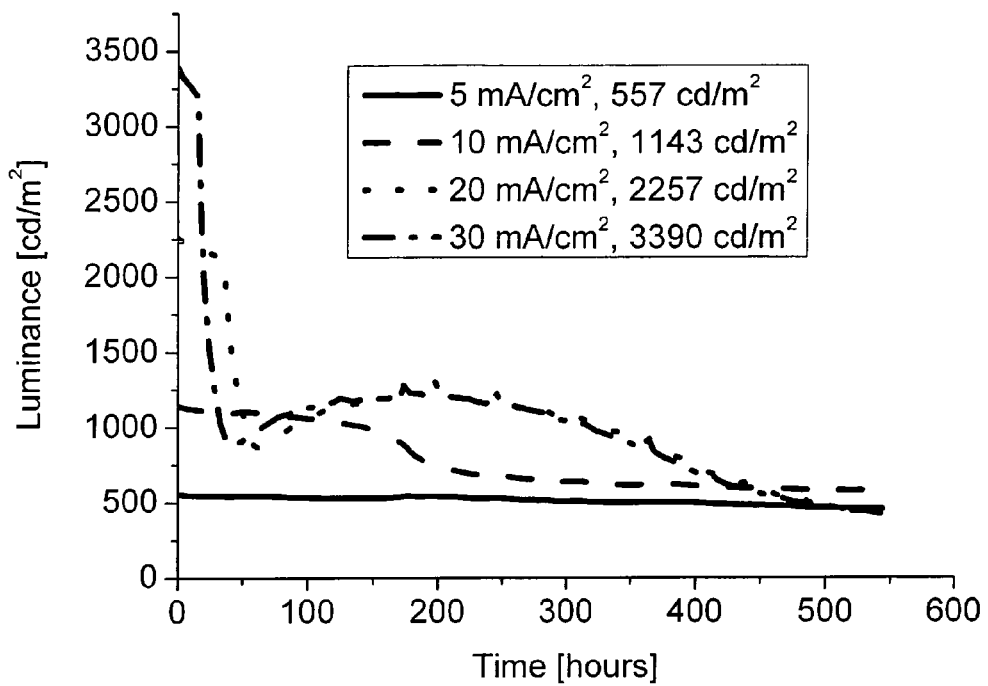
Figure 6B:
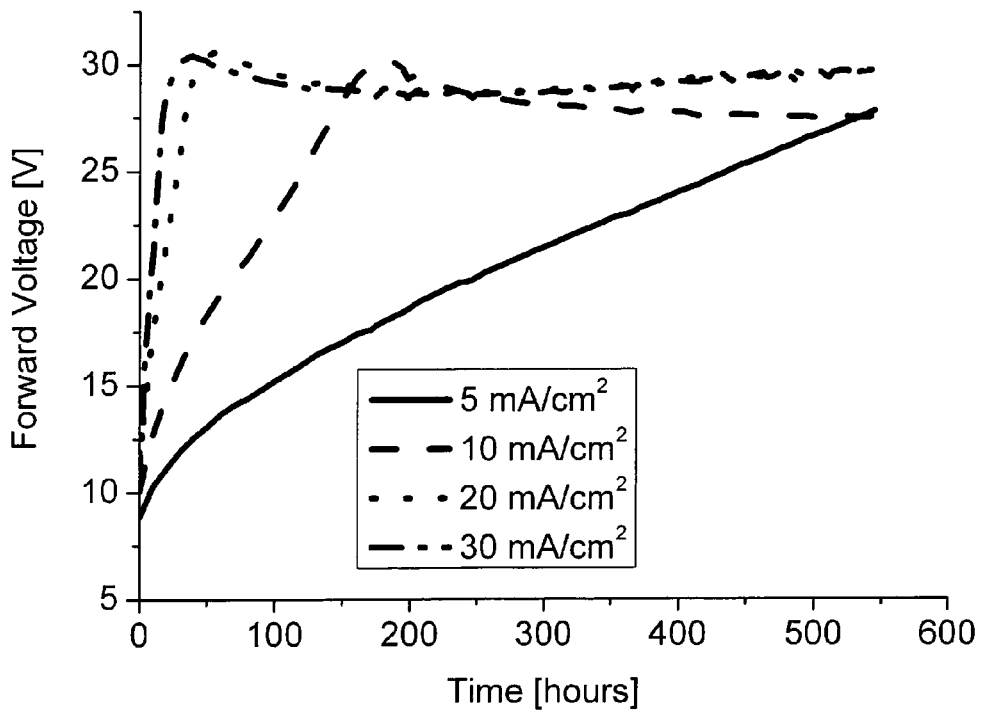
Figure 7A:
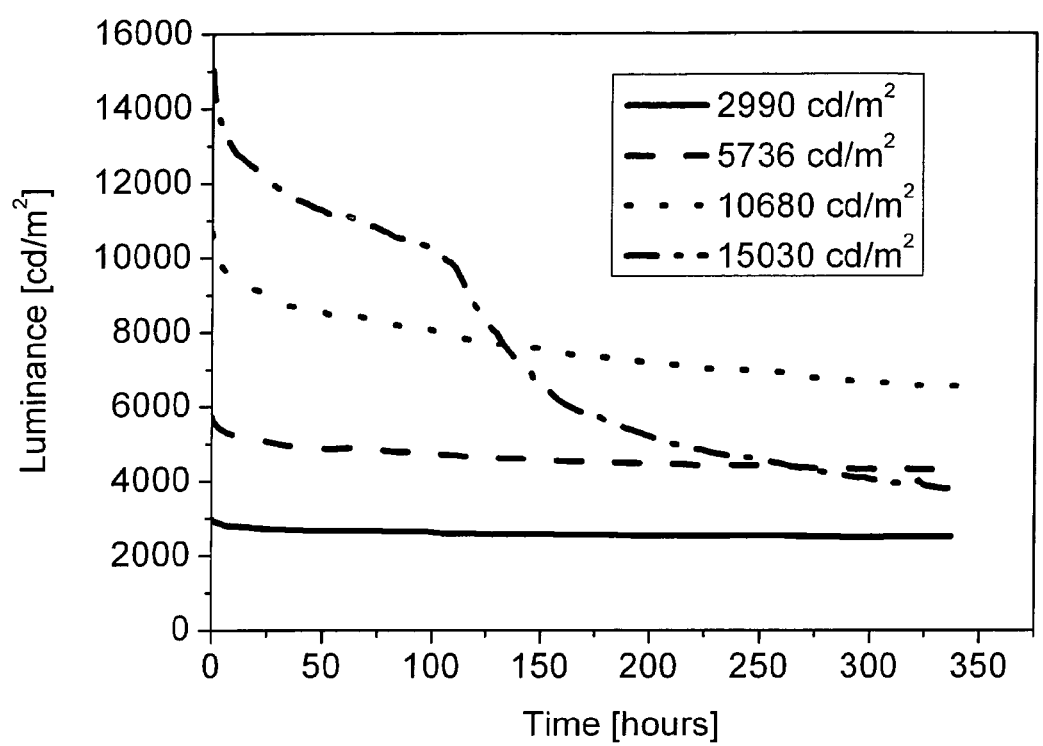
Figure 7B:
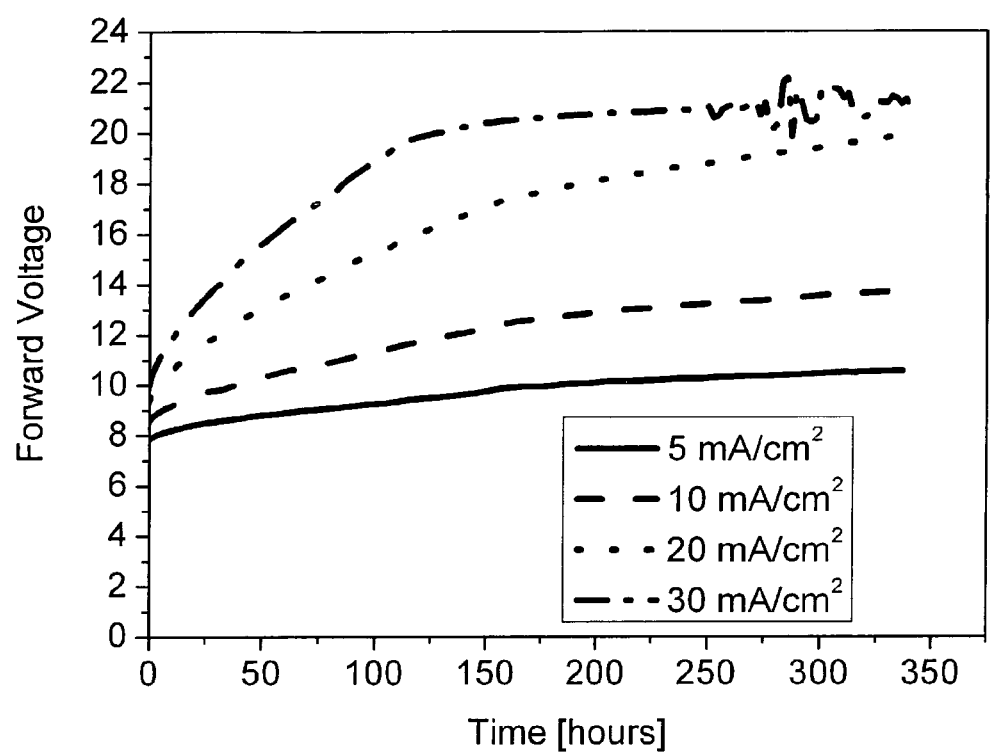
Figure 8A:
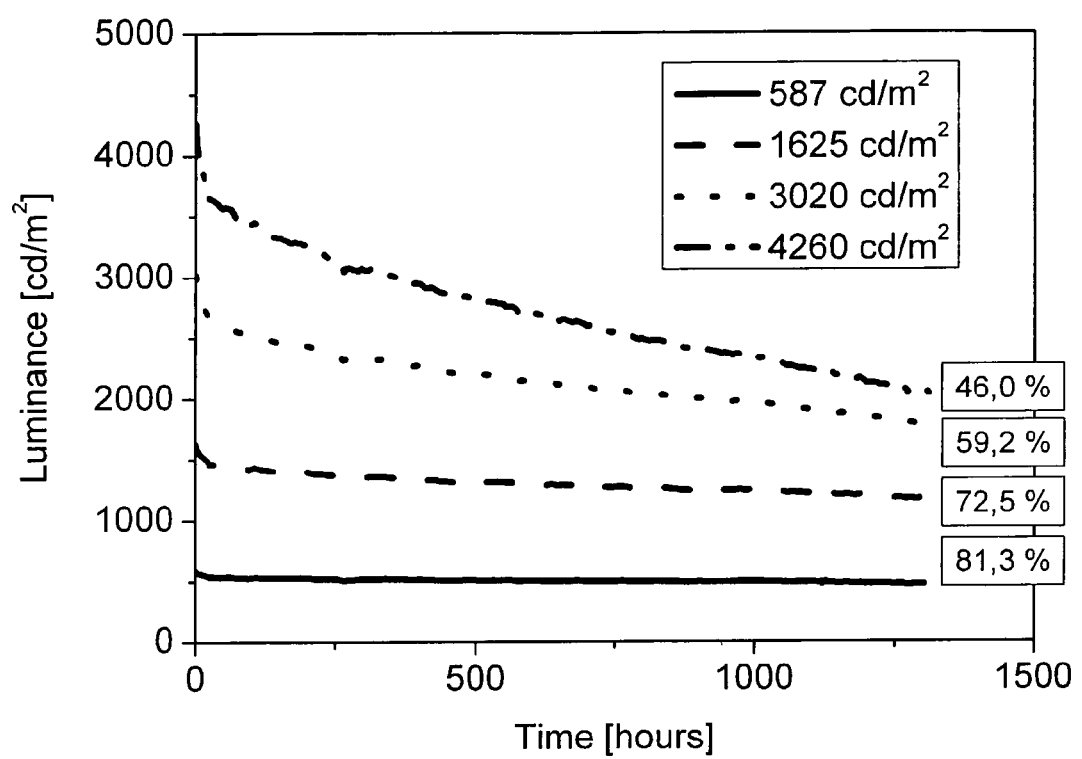
Figure 8B:
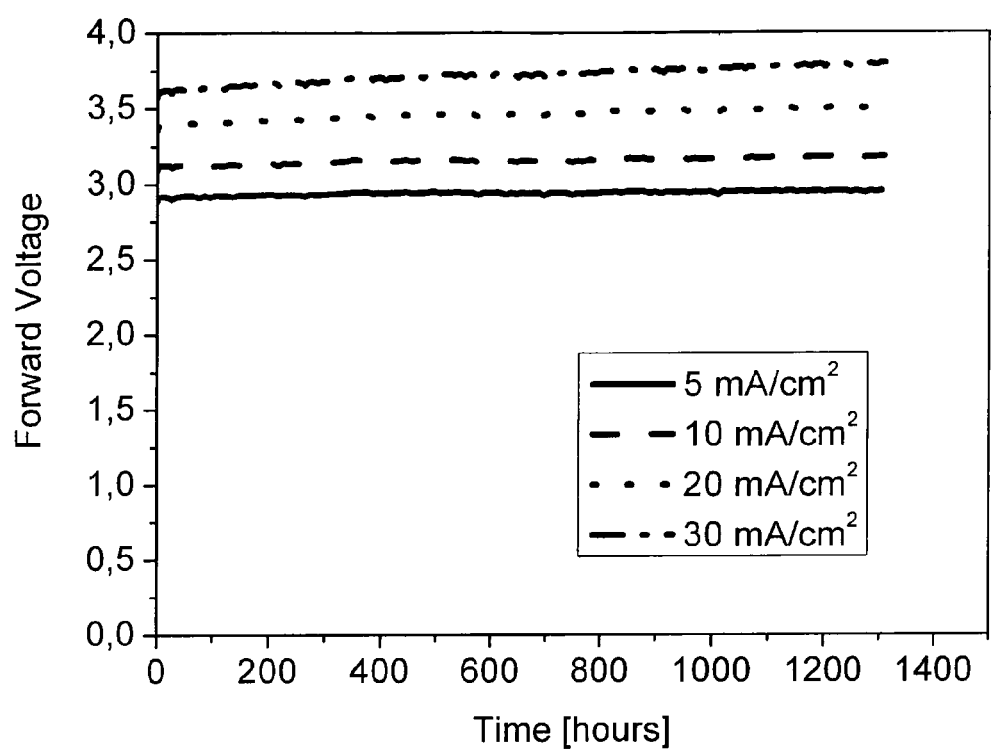
Figure 9A:
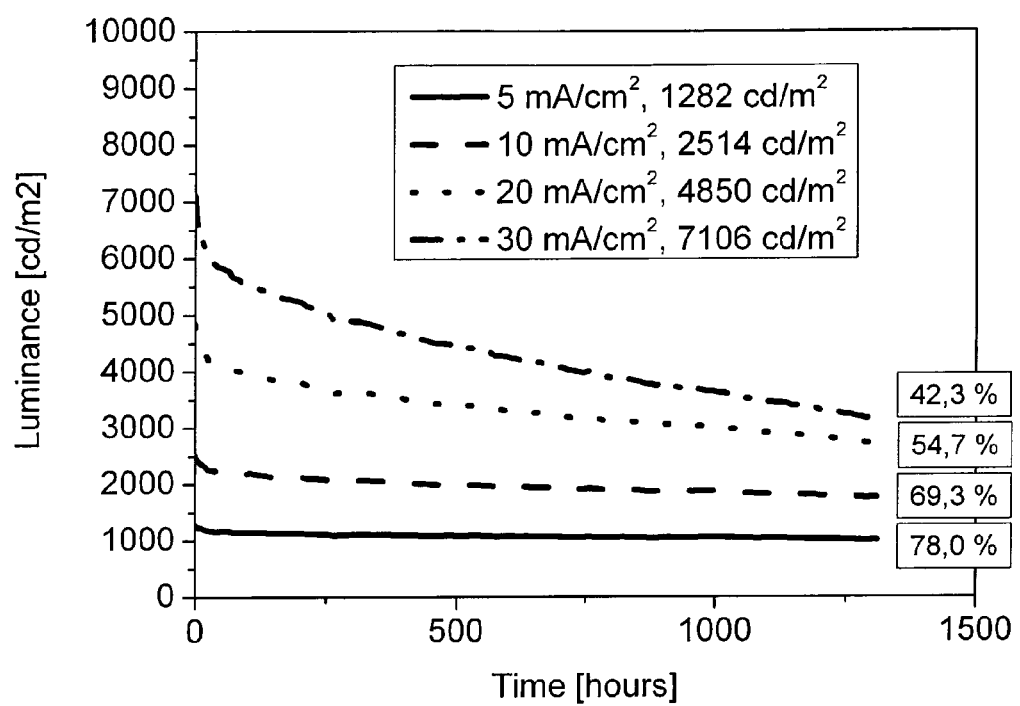
Figure 9B:
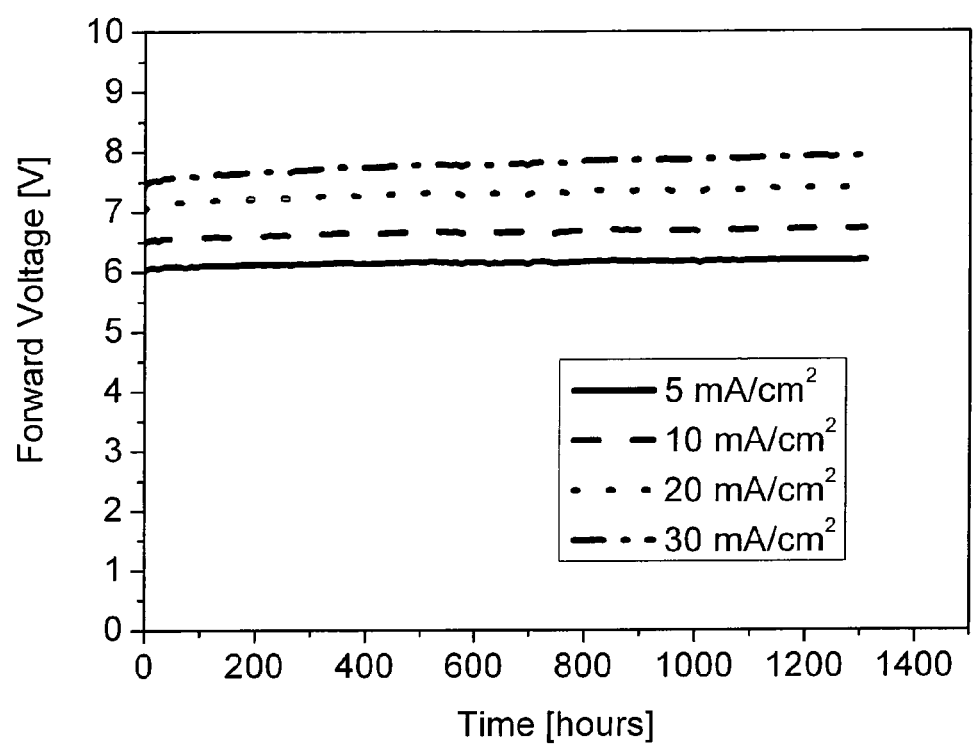
Figure 10A:
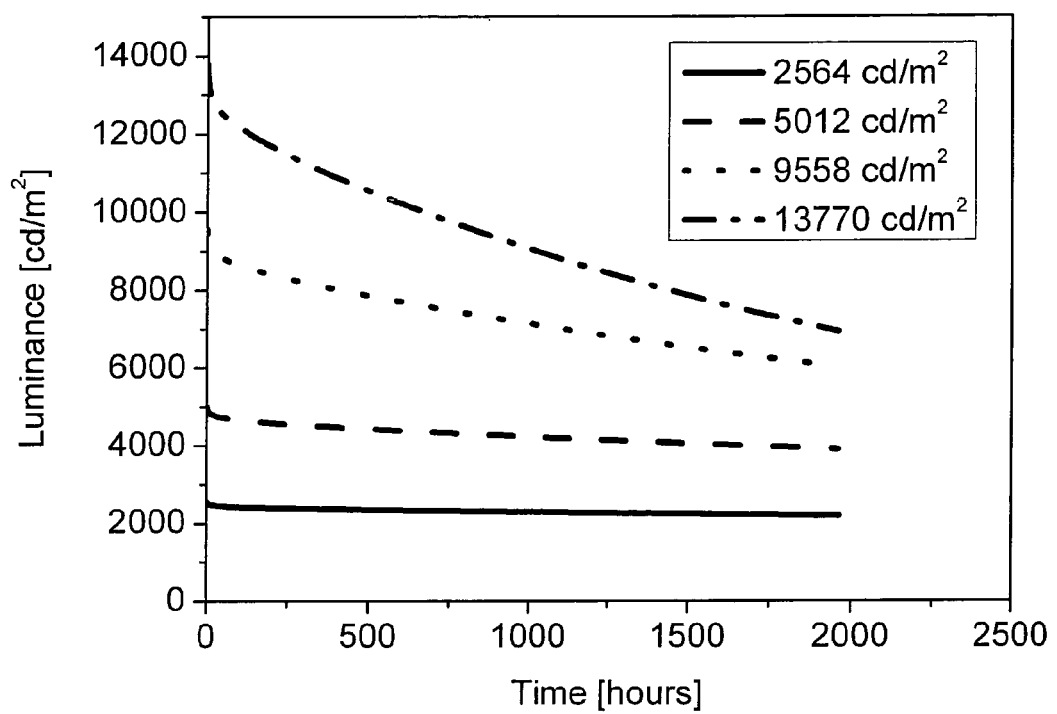
Figure 10B:
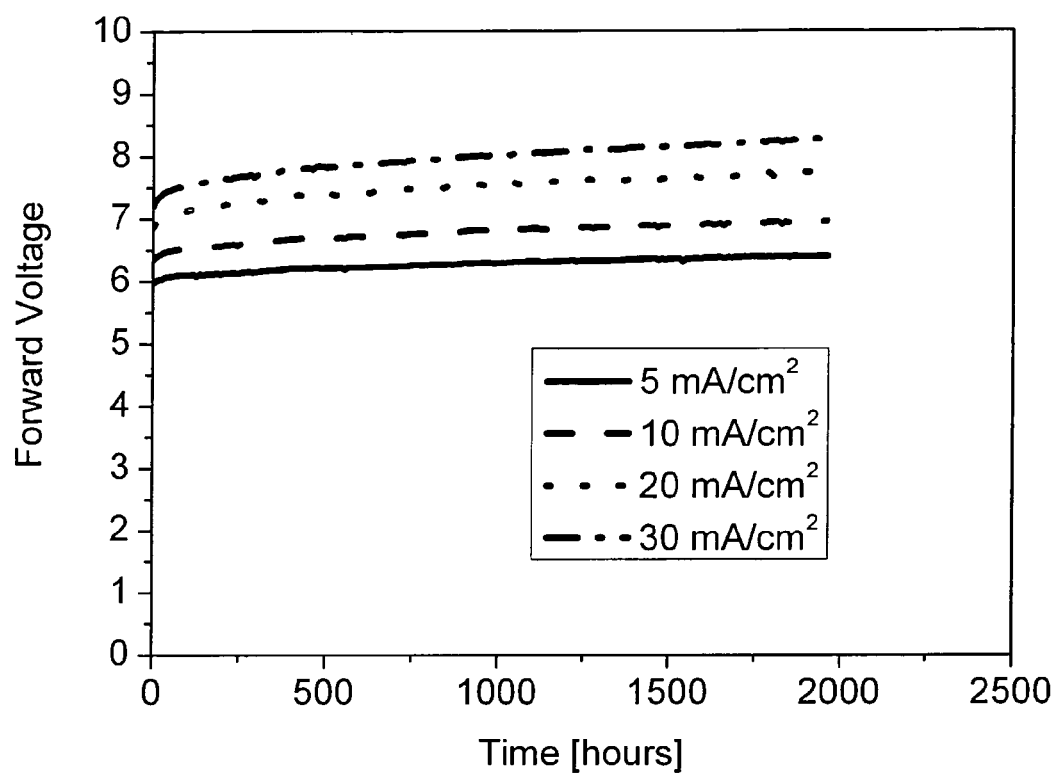
Figure 11A:
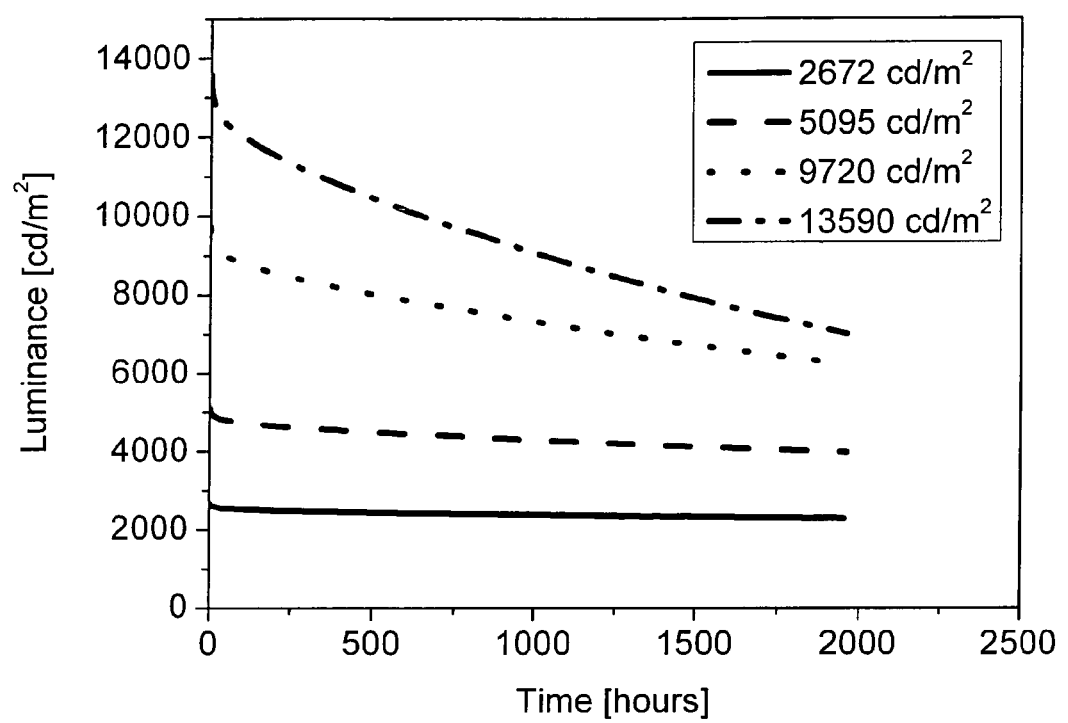
Figure 11B:
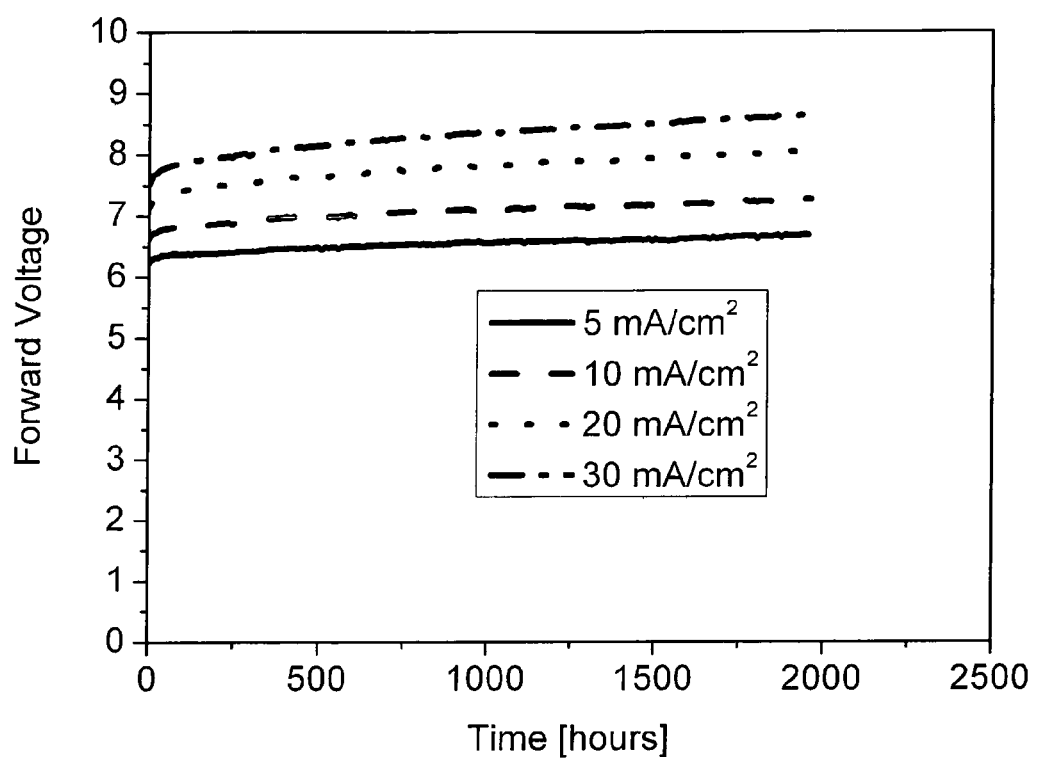

Following the invention will be described in further detail, by way of example, with reference to different embodiments. In the Figures show:

FIG. 1 a schematic presentation of an electronic device comprising a p-n-junction;

FIG. 2 for the electronic device in FIG. 1 a graphical depiction of the current vs. voltage;

FIG. 3 a schematic presentation of a light emitting device with stacked organic electroluminescent units;

FIG. 4 a schematic presentation of an organic electroluminescent unit used in the light emitting device in FIG. 3;

FIG. 5a, 5b for a light emitting device according to an Example 1 (conventional) a graphical depiction of the luminance vs. time (a) and the forward voltage vs. time (b), respectively;

FIG. 6a, 6b for a light emitting device according to an Example 2 a graphical depiction of the luminance vs. time (a) and the forward voltage vs. time (b), respectively;

FIG. 7a, 7b for a light emitting device according to an Example 3 a graphical depiction of the luminance vs. time (a) and the forward voltage vs. time (b), respectively;

FIG. 8a, 8b for a light emitting device according to an Example 4 (conventional) a graphical depiction of the luminance vs. time (a) and the forward voltage vs. time (b), respectively;

FIG. 9a, 9b for a light emitting device according to an Example 5 a graphical depiction of the luminance vs. time (a) and the forward voltage vs. time (b), respectively;

FIG. 10a, 10b for a light emitting device according to an Example 6 a graphical depiction of the luminance vs. time (a) and the forward voltage vs. time (b), respectively; and FIG. 11a, 11b for a light emitting device according to an Example 7 a graphical depiction of the luminance vs. time (a) and the forward voltage vs. time (b), respectively.

Referring to FIG. 1, a structure of two organic layers 10, 11 provided in between an anode 12 made of indium tin oxide (ITO) and a cathode 13 made of aluminum is depicted schematically. The two organic layers 10, 11 realize an organic p-n-junction. FIG. 2 shows the current-voltage characteristic of this organic p-n-junction comprising a p-type doped hole transport layer and an n-type doped electron transport layer sandwiched between the ITO anode 12 and the aluminum cathode 13.

The organic layers 10, 11 and metal are deposited by thermal evaporation onto patterned and pre-cleaned ITO coated glass substrates in an ultrahigh vacuum system at a pressure of $10^{-7}$ mbar without breaking vacuum. The deposition rate and the thickness of the deposited layers are controlled by using a quarz crystal thickness monitor. The area of the p-n-junction between the electrodes 12, 13 is 6.35 mm$^2$.

The organic layer 10 is made of 45 nm 2,2',7,7'-Tetrakis-(N,N-di-methylphenylamino)-9,9'-spirobifluoren doped with 4 mole % 2-(6-Dicyanomethylene-1,3,4,5,7,8-hexafluoro-6H-naph-talen-2-ylidene)-malononitrile thereby providing a p-type doped hole-transport layer. The other organic layer 11 is made of 45 nm 2,4,7,9-Tetraphenyl-1,10-phenanthroline doped with 4 mole % Tetrakis(1,3,4,6,7,8-hexahydro-2H-pyrimido[1,2-a]pyrimidinato)ditungsten (II) thereby providing an n-type doped electron-transport layer. This is an organic p-n-junction.

FIG. 2 shows for the electronic device in FIG. 1 a graphical depiction of the current vs. voltage. Under backward operation at a voltage of −3 V a current of 0.3 mA is measured. In forward operation at a voltage of +3 V a current of 8 mA is flowing. Thus, a rectification ratio of nearly 30 at a very low voltage of ±3V is observed. The rectification ratio is further increased at higher voltages.

Referring to FIG. 3, a light emitting device comprises m (m>1) electroluminescent units:

1. substrate,
2. base electrode, hole injecting anode,
3.1 1$^{st}$ electroluminescent unit,
3.2 2$^{nd}$ electroluminescent unit,
...
3.m m$^{th}$ electroluminescent unit,
4. top electrode, electron injection cathode, where each electroluminescent unit at least has a p-type doped hole-transporting layer closer to the anode, an n-type doped electron-transporting layer closer to the cathode and an electroluminescent layer in between (FIG. 3 and FIG. 4).

In general, regardless of the position of cathode and anode in the stack, the p-type doped hole transport layer is closer to the anode and the n-type doped electron transport layer is closer to the cathode. In this embodiment, for m>2:

at least organic electroluminescent units (3.2, . . . , 3.m−1) not adjacent to the anode (2) or the cathode comprise the p-type doped organic layer as a p-type doped hole transporting-layer, the n-type doped organic layer as a n-type doped electron-transporting layer, and the electroluminescent zone formed between the p-type doped hole transporting layer and the n-type doped electron transporting layer;

in the stack or the inverted stack the n-type doped electron-transporting layer of the k$^{th}$ (2≦k≦m−2) organic electroluminescent unit (3.k) is directly followed by the p-type doped hole-transporting layer of the (k+1)$^{th}$ organic electroluminescent unit (3.k+1), thereby providing a direct contact between the n-type doped electron-transporting layer of the k$^{th}$ organic electroluminescent unit (3.k) with the p-type doped hole-transporting layer of the (k+1)$^{th}$ organic electroluminescent unit (3.k+1); and the first organic electroluminescent unit (3.1) comprises an n-type doped electron-transporting layer which is in contact with the p-type doped hole-transporting layer of the second organic electroluminescent unit (3.2), and the m$^{th}$ organic electroluminescent unit (3.m) comprises a p-type doped hole-transporting layer which is in contact with the n-type doped electron-transporting layer of the (m−1)$^{th}$ organic electroluminescent unit (3.m−1).

Additional layers such as electron or hole blocking layers or interlayers may be employed in the electroluminescent units to improve the efficiencies. In one embodiment the base electrode may function as the substrate.

By the invention the stability of the interface between the adjacent n-doped electron transport layer and p-doped hole transport layer, respectively, is optimized. In the OLED, the interface of the base electrode and the electroluminescent unit adjacent to the base electrode and the interface between the m$^{th}$ electroluminescent unit adjacent to the top electrode and the top electrode may be formed in a different way to optimize the interface of the organic layers to the conductive electrodes. For instance it is known that a carbon fluoride interlayer (CF$_x$) on top of an ITO electrode improves the stability of the interface to the adjacent hole transport layer. As another example, LiF or low work function materials may improve the injection from a top electrode to the adjacent electron transport layer. Such beneficial interlayers may be used in conjunction of the present invention.

Following examples are presented with reference to FIG. 5 to 11 for further understanding of the invention. The materials used in the different light emitting devices are example materials which demonstrate layer setups in a conventional light emitting device and preferred embodiments of the invention. The organic layers and metal are deposited by thermal evaporation onto patterned and pre-cleaned indium tin oxide (ITO) coated glass substrates in an ultra-high vacuum system at $10^{-7}$ mbar (base pressure) without breaking vacuum. The deposition rate and the thickness of the deposited layer are controlled by using a quartz crystal thickness monitor.

The devices described in the following comprise an anode, a cathode, and a plurality of a number of m (m>1) organic electroluminescent units, directly stacked upon each other, forming a cascaded organic electroluminescent device. The organic electroluminescent unit (OLED unit) not adjacent to the electrodes comprises at least a p-type doped hole-transporting layer, an electroluminescent layer and an n-type doped electron-transporting layer. The n-type doped electron-transporting layer comprises an organic main material doped with a molecular donor-type substance and the p-type doped hole-transporting layer comprises an organic main material doped with a molecular acceptor-type substance.

The organic electroluminescent units might furthermore comprise additional hole-injection layers and/or electron injection layers and/or hole-blocking layers and/or electron-blocking layers and/or other types of interlayers between the EML and the HTL and/or the ETL.

There are many organic multilayer light-emitting layer structures known in the art which can be used as light emitting layer within an electroluminescent unit. The electroluminescent layers might consist of one or more consecutive layers containing one or more organic host materials and one or more fluorescent or phosphorescent electroluminescent emitter materials.

The electroluminescent layer may be formed from small organic molecules or from organic polymers.

The m OLED units are consecutively stacked upon each other in a way that the n-type doped electron-transporting layer of the $k^{th}$ unit (0<k<m) is directly followed by the p-type doped hole-transporting layer of the $(k+1)^{th}$ unit without any additional intermediate layers.

EXAMPLE 1

Conventional

According to Example 1a structure for a conventional light emitting device is provided as follows:
1.1 50 nm 2,2',7,7'-Tetrakis-(N,N-di-methylphenylamino)-9,9'-spirobifluorene doped with 2-(6-Dicyanomethylene-1,3,4,5,7,8-hexafluoro-6H-naphtalen-2-ylidene)-malononitrile (p-type doped hole-transport layer);
1.2 10 nm NPB (interlayer);
1.3 20 nm Spiro-DPVBI;
1.4 10 nm Bphen;
1.5 45 nm Bphen doped with Cs (n-type doped electron-transport layer);
1.6 50 nm 2,2',7,7'-Tetrakis-(N,N-di-methylphenylamino)-9,9'-spirobifluorene doped with 2-(6-Dicyanomethylene-1,3,4,5,7,8-hexafluoro-6H-naphtalen-2-ylidene)-malononitrile (p-type doped hole-transport layer);
1.7 10 nm NPB (interlayer);
1.8 20 nm Spiro-DPVBI;
1.9 10 nm Bphen;
1.10 20 nm Bphen doped with Cs (n-type doped electron-transport layer);
1.11 100 nm Aluminum (reflective cathode).

This is a blue stacked PIN-OLED where layers 1.1 to 1.5 constitute a first PIN-OLED unit and layers 1.6 to 1.10 constitute a second PIN-OLED unit. The device reaches a brightness of 1000 cd/m² at 9,7 V with a current efficiency of 8,8 cd/A.

FIGS. 5a and 5b show the lifetime behavior of the conventional light emitting device according to Example 1. Four contacts being on the same substrate are driven at different current densities in DC operation. The driving voltage vs. time characteristics shows a very steep increase of the forward voltage needed for the driven current during the operation of the devices. At approximately 30 V the measurement setup reaches its voltage limit, which can be observed as a luminance breakdown in the luminance vs. time plot.

The conventional light emitting device according to Example 1 comprises a conventional p-n-junction architecture using Cs as an elemental metallic n-dopant. It can be clearly seen, that the performance of the device undergoes rapid breakdown during operation. Even at a relatively low current density of 5 mA/cm² the device operates less than 50 hours.

EXAMPLE 2

According to Example 2a structure for a light emitting device is provided as follows:
2.1 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile as p-type doped hole-transport layer;
2.2 10 nm NPB as interlayer,
2.3 20 nm Spiro-DPVBI;
2.4 10 nm 2,4,7,9-Tetraphenyl-1,10-phenanthroline;
2.5 45 nm 2,4,7,9-Tetraphenyl-1,10-phenanthroline doped with 5 mole % Tetrakis(1,3,4,6,7,8-hexahydro-2H-pyrimido[1,2-a]pyrimidinato)ditungsten (II) as n-type doped electron-transport layer;
2.6 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile as p-type doped hole-transport layer;
2.7 10 nm NPB as interlayer,
2.8 20 nm Spiro-DPVBI;
2.9 10 nm 2,4,7,9-Tetraphenyl-1,10-phenanthroline;
2.10 20 nm 2,4,7,9-Tetraphenyl-1,10-phenanthroline doped with 5 mole % Tetrakis(1,3,4,6,7,8-hexahydro-2H-pyrimido[1,2-a]pyrimidinato)ditungsten (II) as n-type doped electron-transport layer;
2.11 100 nm Aluminum as reflective cathode.

This is a blue stacked PIN-OLED using molecular dopants within the doped charge transport layers where layers 2.1 to 2.5 constitute the first PIN-OLED unit and layers 2.6 to 2.10 constitute the second PIN-OLED unit. The device reaches a brightness of 1000 cd/m² at 8,7 V with a current efficiency of 11,5 cd/A.

FIGS. 6a and 6b show the lifetime behavior of the device. Four OLED contacts being on the same substrate are driven at different current densities in DC operation. The voltage increase for the molecularly doped device is significantly flatter as for a device using Cs doping (example 1). For the lowest driving current density of 5 mA/cm² the voltage limit of the lifetime measurement setup is reached after 550 hours, which is more than ten times as long as for the Cs doped sample.

EXAMPLE 3

According to Example 3a structure for a light emitting device is provided as follows:
3.1 75 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
3.2 10 nm NPB (interlayer);
3.3 20 nm NPB doped with Iridium (III) bis(2-methyldibenzo[f,h]quinoxaline) (acetylacetonate);
3.4 10 nm 2,4,7,9-Tetraphenyl-1,10-phenanthroline;
3.5 60 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
3.6 45 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);

3.7 10 nm NPB (interlayer);
3.8 20 nm NPB doped with Iridium (III) bis(2-methyldibenzo [f,h]quinoxaline) (acetylacetonate);
3.9 10 nm 2,4,7,9-Tetraphenyl-1,10-phenanthroline;
3.10 65 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
3.11 100 nm Aluminum (reflective cathode).

This is a red stacked PIN-OLED using molecular dopants within the doped charge transport layers where layers 3.1 to 3.5 constitute the first PIN-OLED unit and layers 3.6 to 3.10 constitute the second PIN-OLED unit. The device reaches a brightness of 1000 cd/m$^2$ at 6,6 V with a current efficiency of 61,2 cd/A.

FIGS. 7a and 7b show the lifetime behavior of the device. Four OLED contacts being on the same substrate are driven at different current densities in DC operation. The voltage limit of the measurement setup, 22 V in this example, is reached after approximately 120 hours for the highest current density, 30 mA/cm$^2$. For lower current densities the voltage limit is not reached within the first 300 hours of measurement.

EXAMPLE 4

Conventional

According to Example 4a structure for a conventional light emitting device is provided as follows:
4.1 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
4.2 10 nm NPB (interlayer);
4.3 20 nm NPB doped with Iridium (III) bis(2-methyldibenzo [f,h]quinoxaline) (acetylacetonate);
4.4 10 nm 2,4,7,9-Tetraphenyl-1,10-phenanthroline;
4.5 65 nm Iridium (III) Tris(1-phenylisoquinoline) doped with 4 mole % Tetrakis(1,3,4,6,7,8-hexahydro-2H-pyrimido[1,2-a]pyrimidinato)ditungsten (II) (n-type doped electron-transport layer);
4. 100 nm Aluminum (reflective cathode).

This is a red PIN-OLED using molecular dopants within the doped charge transport layers. The device reaches a brightness of 1000 cd/m$^2$ at 2,97 V with a current efficiency of 16,4 cd/A. FIGS. 8a and 8b show the lifetime behavior of the device. Four OLED contacts being on the same substrate are driven at different current densities in DC operation.

FIG. 8a shows the operation lifetime of the device, which is estimated to be 11000 hours at 1000 cd/m$^2$ initial brightness. The forward voltage needed for driving the currents applied during the lifetime measurements are shown in FIG. 8b. The increase in driving voltage is less than 10% up to 50% luminance decay of the device, which is a very small value.

EXAMPLE 5

According to Example 5a structure for a light emitting device is provided as follows:
5.1 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
5.2 10 nm NPB (interlayer);
5.3 20 nm NPB doped with Iridium (III) bis(2-methyldibenzo [f,h]quinoxaline) (acetylacetonate);
5.4 10 nm 2,4,7,9-Tetraphenyl-1,10-phenanthroline;
5.5 65 nm Iridium (III) Tris(1-phenylisoquinoline) doped with 4 mole % Tetrakis(1,3,4,6,7,8-hexahydro-2H-pyrimido[1,2-a]pyrimidinato)ditungsten (II) (n-type doped electron-transport layer);
5.6 60 nm Iridium (III) Tris(1-phenylisoquinoline) doped with 4 mole % 2-(6-Dicyanomethylene-1,3,4,5,7,8-hexafluoro-6H-naphtalen-2-ylidene)-malononitrile (p-type doped hole-transport layer);
5.7 10 nm NPB (interlayer);
5.8 20 nm NPB doped with Iridium (III) bis(2-methyldibenzo [f,h]quinoxaline) (acetylacetonate);
5.9 10 nm 2,4,7,9-Tetraphenyl-1,10-phenanthroline;
5.10 60 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
5.11 100 nm Aluminum (reflective cathode).

This is a red stacked PIN-OLED using molecular dopants within the doped charge transport layers where layers 5.1 to 5.5 constitute the first PIN-OLED unit and layers 5.6 to 5.10 constitute the second PIN-OLED unit. The device reaches a brightness of 1000 cd/m$^2$ at 5,70 V with a current efficiency of 37,1 cd/A. This is more than twice the current efficiency of the device disclosed in comparative Example 4, however the operating voltage needed to reach a brightness of 1000 cd/m$^2$ is less than doubled. Therefore the operation parameters of this stacked OLED are even better than of the non stacked reference device.

FIGS. 9a and 9b show the lifetime behavior of the device. Four OLED contacts being on the same substrate are driven at different current densities in DC operation. FIG. 9a shows the operation lifetime of the device, which is estimated to be 17000 hours at 1000 cd/m$^2$ initial brightness. The forward voltage needed for driving the currents applied during the lifetime measurements are shown in FIG. 9b. The increase in driving voltage is less than 10% up to 50% luminance decay of the device, which is a very small value for OLEDs.

The device according to Example 5 demonstrates, that stacking allows for prolonged lifetimes as compared to non stacked reference devices.

Furthermore the use of Iridium (III) Tris(1-phenylisoquinoline), which has a $T_g$ of >120° C. as charge carrier transport matrix material for the molecular dopants leads to significant improvements in stability of the p-n-interface and an improved stability of the doped films. The increase in operating voltage can by this measure be reduced to a level equal to non stacked OLEDs, therefore the lifetime of the device is no longer limited by the p-n-interface degradation. The direct stacking of PIN-OLEDs onto each other without the use of interlayers therefore can be carried out without a loss in device performance regarding efficiency or lifetime.

EXAMPLE 6

According to Example 6a structure for a light emitting device is provided as follows:
6.1 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
6.2 10 nm NPB (interlayer);
6.3 20 nm NPB doped with Iridium (III) bis(2-methyldibenzo [f,h]quinoxaline) (acetylacetonate);

6.4 10 nm 2,4,7,9-Tetraphenyl-1,10-phenanthroline;
6.5 30 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
6.6 30 nm Iridium (III) Tris(1-phenylisoquinoline) doped with 4 mole % Tetrakis(1,3,4,6,7,8-hexahydro-2H-pyrimido[1,2-a]pyrimidinato)ditungsten (II) (n-type doped electron-transport layer);
6.7 30 nm Iridium (III) Tris(1-phenylisoquinoline) doped with 4 mole % 2-(6-Dicyanomethylene-1,3,4,5,7,8-hexafluoro-6H-naphtalen-2-ylidene)-malononitrile (p-type doped hole-transport layer);
6.8 30 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
6.9 10 nm NPB (interlayer);
6.10 20 nm NPB doped with Iridium (III) bis(2-methyldibenzo[f,h]quinoxaline) (acetylacetonate);
6.11 10 nm 2,4,7,9-Tetraphenyl-1,10-phenanthroline;
6.12 60 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
6.13 100 nm Aluminum (reflective cathode).

This is a red stacked PIN-OLED using molecular dopants within the doped charge transport layers where layers 6.1 to 6.6 constitute the first PIN-OLED unit and layers 6.7 to 6.12 constitute the second PIN-OLED unit. The n-type doped charge carrier transport layer of the first OLED unit consists of two layers as well as the p-type doped charge carrier transport layer of the second OLED unit consists of two layers. The thickness of the p- and n-doped Iridium (III) Tris(1-phenylisoquinoline) layers at the interface of the two PIN-OLED units is 60 nm in total. The device reaches a brightness of 1000 cd/m$^2$ at 5,49 V with a current efficiency of 54,4 cd/A.

FIG. 10a shows the operation lifetime of the device, which is estimated to be approx. 50000 hours at 1000 cd/m$^2$ initial brightness. The forward voltage needed for driving the currents applied during the lifetime measurements are shown in FIG. 10b. The increase in driving voltage is less than 10% up to 50% luminance decay of the device, which is a very small value for OLEDs.

EXAMPLE 7

According to Example 7a structure for a light emitting device is provided as follows:
7.1 50 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
7.2 10 nm NPB (interlayer);
7.3 20 nm NPB doped with Iridium (III) bis(2-methyldibenzo[f,h]quinoxaline) (acetylacetonate);
7.4 10 nm 2,4,7,9-Tetraphenyl-1,10-phenanthroline;
7.5 55 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) (n-type doped electron-transport layer);
7.6 5 nm Iridium (III) Tris(1-phenylisoquinoline) doped with 4 mole % Tetrakis(1,3,4,6,7,8-hexahydro-2H-pyrimido[1,2-a]pyrimidinato)ditungsten (II) (n-type doped electron-transport layer);
7.7 5 nm Iridium (III) Tris(1-phenylisoquinoline) doped with 4 mole % 2-(6-Dicyanomethylene-1,3,4,5,7,8-hexafluoro-6H-naphtalen-2-ylidene)-malononitrile (p-type doped hole-transport layer);
7.8 55 nm 2,2',7,7'-Tetrakis-(N,N-di-methylphenylamino)-9,9'-spirobifluorene doped with 4 mole % 2-(6-Dicyanomethylene-1,3,4,5,7,8-hexafluoro-6H-naphtalen-2-ylidene)-malononitrile (p-type doped hole-transport layer);
7.9 10 nm NPB (interlayer);
7.10 20 nm NPB doped with Iridium (III) bis(2-methyldibenzo[f,h]quinoxaline) (acetylacetonate);
7.11 10 nm 2,4,7,9-Tetraphenyl-1,10-phenanthroline;
7.12 60 nm 2,4,7,9-Tetraphenyl-1,10-phenanthroline doped with 2 mole % Tetrakis(1,3,4,6,7,8-hexahydro-2H-pyrimido[1,2-a]pyrimidinato)ditungsten (II) as n-type doped electron-transport layer;
7.13 100 nm Aluminum (reflective cathode).

This is a red stacked PIN-OLED using molecular dopants within the doped charge transport layers where layers 7.1 to 7.6 constitute the first PIN-OLED unit and layers 7.7 to 7.12 constitute the second PIN-OLED unit. The n-type doped charge carrier transport layer of the first OLED unit consists of two layers as well as the p-type doped charge carrier transport layer of the second OLED unit consists of two layers. The thickness of the p- and n-doped Iridium (III) Tris(1-phenylisoquinoline) layers at the interface of the two PIN-OLED units is 10 nm in total. The device reaches a brightness of 1000 cd/m$^2$ at 5,66 V with a current efficiency of 54,5 cd/A.

FIG. 11a shows the operation lifetime of the device, which is estimated to be approx. 50000 hours at 1000 cd/m$^2$ initial brightness. The forward voltage needed for driving the currents applied during the lifetime measurements are shown in FIG. 11b. The increase in driving voltage is less than 10% up to 50% luminance decay of the device, which is a very small value for OLEDs.

It can be seen that a significant reduction of the overall thickness of the p- and n-doped Iridium (III) Tris(1-phenylisoquinoline) layers at the interface of the two PIN-OLED units leads to no reduction in device performance as compared with sample number eight, where the p- and n-doped Iridium (III) Tris(1-phenylisoquinoline) layers have a total thickness of 60 nm at the interface between the two PIN-OLED units of the device.

The reduction of the thickness of the doped Iridium (III) Tris(1-phenylisoquinoline) layers is beneficial to minimize absorption losses of the light emitted within the light emitting device, furthermore the reduced thickness of the doped Iridium (III) Tris(1-phenylisoquinoline) layers might lead to cost reductions in a mass production of the devices.

The features disclosed in this specification, claims and/or the figures may be material for the realization of the invention in its various embodiments, taken in isolation or in various combinations thereof.

The invention claimed is:
1. An electronic device comprising a layer structure of organic layers, wherein said layer structure comprises a p-n-junction between an n-type doped organic layer provided as an organic matrix material doped with an n-type dopant and a p-type doped organic layer provided as a further organic matrix material doped with a p-type dopant, and wherein the n-type dopant and the p-type dopant both are molecular dopants, characterized in that
- a reduction potential of the p-type dopant is equal or larger than about 0 V vs. Fc/Fc$^+$,
- an oxidation potential of the n-type dopant is equal or smaller than about −1.5 V vs. Fc/Fc $^+$, and
- at least one of the evaporation temperature of the n-type dopant and the evaporation temperature of the p-type dopant is higher than about 120° C.

2. Electronic device according to claim 1, wherein a molecular weight of the n-type dopant and/or a molecular weight of the p-type dopant are larger than about 300 g/mol.

3. Electronic device according to claim 1, wherein the reduction potential of the p-type dopant is equal or larger than about 0.18 V vs. Fc/Fc$^+$, preferably equal or larger than about 0.24 V vs. Fc/Fc$^+$.

4. Electronic device according to claim 1, wherein the oxidation potential of the n-type dopant is equal or smaller than about −2.0 V vs. Fc/Fc$^+$, preferably equal or smaller than about −2.2 V vs. Fc/Fc$^+$.

5. Electronic device according to claim 1, wherein a glass transition temperature ($T_g$) of the matrix material and/or a glass transition temperature ($T_g$) of the further matrix material are equal or larger than about 75° C., preferably equal or larger than about 100° C., more preferably equal or larger than about 120° C.

6. Electronic device according to claim 1, wherein the matrix material and the further matrix material are made of the same material.

7. Electronic device according to claim 1, wherein the n-type doped organic layer is provided as a multilayer structure.

8. Electronic device according to claim 1, wherein the p-type doped organic layer is provided as a multilayer structure.

9. Electronic device according to claim 1, wherein the layer structure is provided in an organic light emitting device.

10. Electronic device according to claim 9, wherein the organic light emitting device comprises an anode (2), a cathode (4), and a plurality of organic electroluminescent units (3.1, . . ., 3.m;m≧2) each comprising an electroluminescent zone (EML), where the organic electroluminescent units are provided upon each other in a stack or an inverted stack between the anode (2) and the cathode (4), and where the p-n-junction is provided at an interface between adjacent organic electroluminescent units.

11. Electronic device according to claim 10, wherein for m >2:
- at least organic electroluminescent units (3.2, . . ., 3.m−1) not adjacent to the anode (2) or the cathode (4) comprise the p-type doped organic layer as a p-type doped hole transporting-layer (HTL), the n-type doped organic layer as an n-type doped electron-transporting layer (ETL), and the electroluminescent zone (EML) formed between the p-type doped hole transporting layer (HTL) and the n-type doped electron transporting layer (ETL);
- in the stack or the inverted stack the n-type doped electron-transporting layer (ETL) of the k$^{th}$ (2<k<m−2) organic electroluminescent unit (3.k) is directly followed by the p-type doped hole-transporting layer (HTL) of the (k+1)$^{th}$ organic electroluminescent unit (3.k+1), thereby providing a direct contact between the n-type doped electron-transporting layer (ETL) of the k$^{th}$ organic electroluminescent unit (3.k) with the p-type doped hole-transporting layer (HTL) of the (k+1)$^{th}$ organic electroluminescent unit (3.k+1); and
- the first organic electroluminescent unit (3.1) comprises an n-type doped electro-transporting layer (ETL) which is in contact with the p-type doped hole-transporting layer (HTL) of the second organic electroluminescent unit (3.2), and the m$^{th}$ organic electroluminescent unit (3.m) comprises a p-type doped hole-transporting layer (HTL) which is in contact with the n-type doped electron-transporting layer (ETL) of the (m−1)$^{th}$ organic electroluminescent unit (3.m−1).

12. Electronic device according to claim 10, wherein for m=2:
- a first electroluminescent unit (3.1) comprises the n-type doped organic layer as an n-type doped electron-transporting layer (ETL);
- a second electroluminescent unit (3.2) comprises the p-type doped organic layer as a p-type doped hole transporting-layer (HTL); and
- the n-type doped electron-transporting layer (ETL) of the first electroluminescent unit (3.1) is in contact with the p-type doped hole-transporting layer (HTL) of the second organic electroluminescent unit (3.2), thereby providing a p-n-junction between the two adjacent organic electroluminescent units (3.1, 3.2).

13. Electronic device according to claim 10, wherein at least one of the organic electroluminescent units (3.1, . . ., 3.m; 3.1, 3.2) further comprises at least one of the following layers: a hole-injection layer (HIL), an electron-injection layer (EIL), an interlayer in between the p-type doped hole-transporting layer and the electroluminescent zone, and a further interlayer between the n-type doped electron-transporting layer and the electroluminescent zone.

14. Electronic device according to claim 10, wherein for at least one of the organic electroluminescent units (3.1, . . ., 3.m; 3.1, 3.2) the electroluminescent zone is formed by a multilayer structure of organic layers.

15. Electronic device according to claim 10, wherein for at least one of the organic electroluminescent units (3.1, . . ., 3.m; 3.1, 3.2) the electroluminescent zone is formed from a material of small molecules and/or from organic polymers.

16. Electronic device according to claim 10, wherein the organic electroluminescent units (3.1, . . ., 3.m; 3.1, 3.2) emit light of different wavelengths.

17. Electronic device according to claim 16, wherein white light is emitted by the plurality of organic electroluminescent units (3.1, . . .,3.m; 3.1, 3.2).

18. Electronic device according to claim 1, wherein at least one of the evaporation temperature of the n-type dopant and the evaporation temperature of the p-type dopant is higher than about 140° C.

* * * * *